United States Patent
Takase et al.

(10) Patent No.: US 7,581,058 B2
(45) Date of Patent: *Aug. 25, 2009

(54) NON-VOLATILE MEMORY HAVING MULTIPLE ERASE OPERATIONS

(75) Inventors: Yoshinori Takase, Tokyo (JP); Keiichi Yoshida, Takarazuka (JP); Takashi Horii, Higashimurayama (JP); Atsushi Nozoe, Hino (JP); Takayuki Tamura, Higashiyamato (JP); Tomoyuki Fujisawa, Takarazuka (JP); Ken Matsubara, Higashimurayama (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/963,913

(22) Filed: Dec. 24, 2007

(65) Prior Publication Data

US 2008/0098190 A1 Apr. 24, 2008

Related U.S. Application Data

(63) Continuation of application No. 10/510,150, filed as application No. PCT/JP02/11953 on Nov. 15, 2002, now Pat. No. 7,334,080.

(30) Foreign Application Priority Data

Apr. 5, 2002 (WO) ............... PCT/JP02/03417

(51) Int. Cl.
*G06F 12/06* (2006.01)
(52) U.S. Cl. .................. 711/103; 711/102
(58) Field of Classification Search ............. None
See application file for complete search history.

(56) References Cited

U.S. PATENT DOCUMENTS

| | | | |
|---|---|---|---|
| 5,297,029 A | 3/1994 | Nakai et al. | 365/238.5 |
| 5,422,856 A | 6/1995 | Sasaki et al. | 365/230.03 |
| 6,366,977 B1 | 4/2002 | Mizoguchi | 711/103 |
| 6,434,658 B1 * | 8/2002 | Fukuzumi | 711/103 |

(Continued)

FOREIGN PATENT DOCUMENTS

JP 5-282882 10/1993

(Continued)

*Primary Examiner*—Than Nguyen
(74) *Attorney, Agent, or Firm*—Miles & Stockbridge P.C.

(57) ABSTRACT

A non-volatile storage device (1) has non-volatile memory units (FARY0 to FARY3), buffer units (BMRY0 to BMRY3) and a control unit (CNT), and the control unit can control a first access processing between an outside and the buffer unit and a second access processing between the non-volatile memory unit and the buffer unit upon receipt of directives from the outside separately from each other. The control unit can independently carry out an access control over the non-volatile memory unit and the buffer unit in accordance with the directives sent from the outside, respectively. Therefore, it is possible to set up next write data to the buffer unit simultaneously with the erase operation of the non-volatile memory unit or to output once read storage information to the buffer unit at a high speed as in a cache memory operation in accordance with the directive sent from the outside. Consequently, it is possible to reduce the overhead of a data transfer for reading/writing data from/to the non-volatile storage device.

3 Claims, 33 Drawing Sheets

U.S. PATENT DOCUMENTS

| | | | |
|---|---|---|---|
| 6,748,482 B1 * | 6/2004 | Fackenthal | 711/103 |
| 6,920,522 B2 * | 7/2005 | Roohparvar | 711/103 |
| 7,080,193 B2 | 7/2006 | Roohparvar | 711/103 |
| 7,149,844 B2 * | 12/2006 | Bernardi et al. | 711/103 |
| 7,191,308 B2 * | 3/2007 | Hara et al. | 711/213 |
| 2004/0172499 A1 | 9/2004 | Roohparvar | 711/103 |
| 2004/0177216 A1 | 9/2004 | Asari et al. | 711/103 |
| 2005/0132129 A1 | 6/2005 | Venkiteswaran | 711/103 |

FOREIGN PATENT DOCUMENTS

| | | |
|---|---|---|
| JP | 6-259320 | 9/1994 |
| JP | 11-85609 | 3/1999 |
| JP | 11-149788 | 6/1999 |
| JP | 2001-325796 | 11/2001 |

\* cited by examiner

FIG.7

| No. | Com1 | CA | PA | Com2 | BMPY CLEAR | TYPE | SUMMARY |
|---|---|---|---|---|---|---|---|
| 1 | 00H | ○ | ○ | 30H | × | Continuous 4-page (old sector) read | Read 4 continuous pages (4 pages at maximum) |
| 2 | 05H | ○ | × | E0H | × | Set CA for Random Output in a page | Set CA in read (the optional number of times can be input) |
| 3 | 06H | ○ | ○ | E1H | × | Set CA and PA for Random Output | Set CA and PA in read (the optional number of times can be input) |
| 4 | 80H | ○ | ○ | 11H | ○ | Write set-up | Set up a write |
| 5 | 80H | ○ | ○ | 10H | ○ | Write | Write for a bank set with 4 and 5 (simple upper end) |
| 6 | 85H | ○ | × | × | × | Set CA for Random Input | Write 4 continuous pages |
| 7 | 00H | ○ | ○ | 35H | × | Read for a copy pack | Read 1 page for 1 bank |
| 8 | 85H | ○ | ○ | 10H | × | Write for a copy pack | Write data read to BMRY |
| 9 | 80H | ○ | ○ | 15H | ○ | Cache program | Open BMRY which is identical to No.5 and is not used in a write |
| 10 | 60H | × | ○ | D0H | × | Block erase | Erase 1 block for 1 bank |
| 11 | 7*H | × | × | × | × | Status read | Read a status code (70H to 76H) |
| 12 | 90H | × | × | × | × | ID read | Read an ID code |
| 13 | FFH | × | × | × | × | Forcible reset | Reset an internal state and clear a status register |
| 14 | 00H | ○ | ○ | 31H | × | Different bank read | Read to |
| 15 | 80H | ○ | ○ | 12H | ○ | Different bank write | Write to (simple upper end) |
| 16 | 80H | ○ | ○ | 13H | ○ | Continuous 4-page write | Write data for 4 continuous pages |
| 17 | 80H | ○ | ○ | 16H | ○ | Write 2 | Write having No. 5 preverify |
| 18 | 80H | ○ | ○ | 17H | ○ | Different bank write 2 | Write having No. 15 preverify |
| 19 | 80H | ○ | ○ | 18H | ○ | Continuous 4-page write 2 | Write having No. 16 preverify |
| 20 | 00H | ○ | ○ | 3AH | × | Binary read | Read in a binary mode |
| 21 | 60H | × | × | D1H | × | Continuous 4-block erase | Erase 4 continuous blocks |
| 22 | FEH | × | × | × | ○ | Buffer clear | Clear all BMRY buffers |

NON-VOLATILE MEMORY HAVING MULTIPLE ERASE OPERATIONS

CROSS-REFERENCE TO RELATED APPLICATION

This application is a continuation of application Ser. No. 10/510,150 filed May 3, 2005 now U.S Pat. No. 7,334,080, which is a 371 of PCT international application no. PCT/JP02/11953 filed on Nov. 15, 2002, the content of which is hereby incorporated by reference into this application.

BACKGROUND OF THE INVENTION

The present invention relates to a non-volatile storage device having a non-volatile memory unit and a buffer unit thereof, and to an effective technology for an application to a flash memory having a multibank, for example.

BACKGROUND ART

JP-A-11-85609 has described a flash memory having a non-volatile memory unit and a buffer unit thereof. According to the publication, the memory unit can carry out read/write only on a unit of 8 bits or 16 bits, while it is necessary to exchange data on a unit of a single or plural sector(s) such as 512 bytes together with a host device, and therefore, the buffer unit is provided and utilized as a cache memory. The buffer unit to be utilized as the cache memory is simply used tacitly in an inner part when a command such as an erase, a program (hereinafter referred to also as a write) or a read for the flash memory is to be executed. In short, the buffer unit is not intended for a direct operation from the outside of the flash memory. In this respect, the inventor made considerations and found the following matters. First of all, the utilization of the buffer unit is not originally required in an erase operation for the non-volatile memory unit and cannot be applied to other uses. For this reason, an on-chip buffer unit cannot be effectively used practically during the erase operation. Moreover, the operation cannot be carried out in such a manner that storage information stored once in the buffer unit is to be read to an outside at a high speed independently of the operation of the non-volatile memory unit. In relation thereto, JP-A-6-259320 and JP-A-11-149788 have described a non-volatile storage device comprising a non-volatile memory unit and a buffer unit for holding data from an outside and serving to carry out such a control as to utilize the buffer unit as a cache memory. For a non-volatile storage device having a multibank, however, the inventor has found that there is room for further reducing the overhead of a data transfer between the outside and the flash memory in order to increase the speed of an access operation.

It is an object of the invention to provide a non-volatile storage device capable of effectively using a buffer unit practically during an erase operation for a non-volatile memory unit.

It is another object of the invention to provide a non-volatile storage device capable of quickly reading storage information read from the non-volatile memory unit and retained in the buffer unit to an outside independently of the operation of the non-volatile memory unit.

It is a further object of the invention to provide a non-volatile storage device capable of reducing the overhead of a data transfer between the outside and the no-volatile memory unit.

The above and other objects and novel features of the invention will be apparent from the following description of the specification and the accompanying drawings.

SUMMARY OF THE INVENTION

[1] <<Independent Access Control>> A non-volatile storage device according to the invention has a plurality of banks (BNK0 to BNK3) and a control unit (CNT), wherein the banks (BNK0 to BNK3) have non-volatile memory units (FARY0 to FARY3) and buffer units (BMRY0 to BMRY3) corresponding thereto. The non-volatile memory unit of each bank can be caused to carry out an access operation independently. The control unit can carry out a control upon receipt of a directive (22, 23) of a first access processing between an outside and the buffer unit and a directive (21, 24) of a second access processing between the non-volatile memory unit and the buffer unit from the outside separately from each other. The first access processing includes an access to one buffer unit, and the second access processing includes an access to one non-volatile memory unit and an access to a plurality of non-volatile memory units and can be caused to select either of the accesses.

As described above, the control unit can carry out the access control over the non-volatile memory unit having a multibank and the buffer unit independently in accordance with the directives sent from an outside, respectively. Therefore, the non-volatile memory unit and the buffer unit can be operated in parallel and storage information read once onto the buffer unit can be output at a high speed as in the operation of a cache memory in accordance with a directive sent from the outside. Consequently, it is possible to reduce the overhead of a data transfer for reading/writing data from/to the non-volatile storage device having the multibank.

<<First Access Processing>> In a specific manner according to the invention, the directive of the first access processing serves to store (hereinafter referred to also as a write) data input from the outside to the buffer unit or to read data from the buffer unit to the outside. The directive for writing or the directive for reading is given by a change in one or a plurality of control signals (CLE, ALE, WEb, REb) input from the outside, for example. More specifically, the directive for writing is given in a write enable state in command latch disable and address latch disable. Moreover, the directive for reading is given in a read enable state in the command latch disable and the address latch disable. The state of a control signal such as the single or plural strobe signals can also be regarded as a command code. It is also possible to employ a different command code from the strobe signal for the directive of the first access processing.

In a specific manner according to the invention, state directive information (R/Bb) for indicating that the second access processing is being carried out is output to the outside. It is possible to easily control the directive timing of the read enable or the write enable which is sent from the outside.

<<Second Access Processing>> In a specific manner according to the invention, the directive of the second access processing is given in accordance with an access command. The access command has a first access command for giving a directive to read data from the buffer unit and to write the data to the non-volatile memory unit, a second access command for giving a directive to read the data from the non-volatile memory unit and to write the data to the buffer unit, or a third access command for giving a directive to erase the data of the non-volatile memory unit. In the invention, a word of write can be replaced with a word of store when a volatile memory unit such as a buffer unit is caused to hold information, and furthermore, can be replaced with a word of program when the non-volatile memory unit is caused to hold the information.

<<Plural Memory Banks>> In a specific manner according to the invention, the non-volatile memory unit and the buffer unit are caused to correspond to each other and plural sets of correspondences are provided as memory banks.

<<Address Command>> An address command (20) is employed for specifying an access address at this time, for example. The control unit can recognize an address command supplied from the outside, and the address command can specify a storage region of the buffer unit and a storage region of the non-volatile memory unit.

As a specific example, the address command can have first specification information, second specification information and third specification information. The first specification information specifies a non-volatile memory unit and tacitly specifies a buffer unit corresponding to the non-volatile memory unit thus specified. The second specification information specifies an accessing object address in the non-volatile memory unit which is specified. The third specification information specifies an accessing object address in the buffer unit which is specified.

Attention is paid to the utilization efficiency of the buffer unit. While the buffer unit can be specified freely in the first access processing, the buffer unit corresponding to the non-volatile memory unit is specified tacitly in the second access processing. In order to expand the specification, it is preferable that the control unit should regard the specification of the buffer unit based on the first specification information as the specification of another buffer unit which does not correspond to the non-volatile memory unit when responding to the specific directive of the second access processing.

<<Parallelization of First Access Processing and Second Access Processing>> In a specific manner according to the invention, the control unit can carry out the second access processing of the non-volatile memory unit and the first access processing of another buffer unit which does not correspond to the non-volatile memory unit at the same time depending on the directive states of the first and second access processings. Moreover, the control unit can carry out an erase processing of the non-volatile memory unit and the first access processing of the buffer unit at the same time. For example, during the erase operation of the non-volatile memory unit, write data are input to the buffer unit corresponding to the non-volatile memory unit. In short, during the access operation of the non-volatile memory unit, data to be used next are input to the buffer unit on a background thereof.

<<Maintenance of Storage Data of Buffer Unit>> When taking a different viewpoint of the parallelization of the access processing, the control unit maintains storage information of the buffer unit in such a state as to carry out a processing of responding to a directive of the second access processing of reading data from the buffer unit and writing the data to the non-volatile memory unit and to then wait for another directive of the first access processing or the second access processing. In the case in which the storage information held by the buffer unit are to be copied onto another place of the non-volatile memory unit or a retrial for a write error is to be carried out, consequently, the invention is convenient. Moreover, the control unit maintains storage information of the buffer unit in such a state as to carry out a processing of responding to a directive of the first access processing of reading data from the buffer unit and outputting the data to an outside and to then wait for another directive of the first access processing or the second access processing. Consequently, the storage information read once to the buffer unit can be output at a high speed as in the operation of a cache memory in accordance with a directive sent from the outside.

The control unit initializes storage information of the buffer unit in accordance with a buffer clear command in such a manner that unnecessary data can be deleted when the storage information is to be maintained in the buffer unit. In order to prevent unnecessary data remaining in the buffer unit from being written erroneously in the write, moreover, the storage information of the buffer unit is initialized before the write of data input from the outside to the buffer unit when the write is to be carried out in response to the first access processing.

<<Read Cache Operation of Buffer Unit>> In a specific manner according to the invention, the control unit can transfer data read from the non-volatile memory unit and written to the buffer unit through the second access processing at plural times in a different timing from the buffer unit to the outside through the first access processing to be carried out at plural times which is designated from the outside. Consequently, the buffer unit can be caused to carry out a read cache operation by a control sent from the outside.

Moreover, the control unit omits a second access processing of writing data from the non-volatile memory unit to the buffer unit which sets the same address as that on the non-volatile memory unit of data retained in the buffer unit to be an access processing object when a directive of the second access processing is given. Consequently, the non-volatile storage device can carry out an address comparison by itself, thereby causing the buffer unit to perform the read cache operation. For the address comparing operation, for example, there are provided address holding means for holding address information about an address on the non-volatile memory unit of the data retained in the buffer unit, and comparing means for comparing the address information held in the address holding means with address information about an address of the non-volatile memory unit which is set to be a data reading object in the second access processing.

The read cache operation control of the buffer unit by the control unit is equivalent to a control for varying a period of a busy state based on a signal indicating, as the busy state, that the second access processing is being carried out depending on presence of the omission of the second access processing when a directive for outputting data written from the non-volatile memory unit to the buffer unit in the second access processing from the buffer unit to the outside is given through the first access processing.

<<Copy and Rewrite of Utilization of Buffer Unit>> In a specific manner according to the invention, the control unit can write data written from the outside to the buffer unit by the first access processing at plural times from the buffer unit to the non-volatile memory unit through the second access processing carried out at plural times. Consequently, it is possible to efficiently carry out copy and write retrial processings.

<<Decision of Write Data over Buffer Unit>> In a specific manner according to the invention, the control unit can write data rewritten from the outside onto the buffer unit by the first access processing carried out at plural times from the buffer unit to the non-volatile memory unit through the second access processing. For example, a processing efficiency can be enhanced when a read/modify/write operation is to be repeated many times for the same sector data.

<<Binary Mode>> In a specific manner according to the invention, the non-volatile memory unit can store multivalued information of 2 bits or more in one storage element and the buffer unit can store binary information of 1 bit in one storage element. At this time, the control unit can regard storage information of the non-volatile memory unit as binary information and can control a third access processing of omitting a converting operation from a multivalue to a binary.

Consequently, a time required for reading data to an outside is shortened. If the object of the third access processing is set to be management domain data for the sector of file data, for example, it is possible to quickly decide the presence of the validity or alternative of a sector, thereby contributing to an increase in the speed of a file access.

<<Independent Clock Generation>> In a specific manner according to the invention, there is provided, on a signal path to be used for the first access processing, an address buffer for latching address information sent from the outside, a buffer unit address buffer for inputting an output of the address buffer and supplying the output to the buffer unit, a buffer unit data buffer for latching data output from the buffer unit, and a data buffer for latching data output from the buffer unit data buffer and outputting the data to the outside. Attention is paid to the structure in which a comparatively large number of pipeline stages from the address input to the data output are provided. At this time, the control unit independently generates a clock and creates a latch timing of the buffer unit address buffer and a latch timing of the buffer unit data buffer while an address command is recognized synchronously with a first strobe signal and a second strobe signal for giving a directive to read data to the outside in the first access processing is then changed. Even if the number of the pipeline stages from the address input to the data output is comparatively large, a countermeasure can be taken.

<<Rewrite Operation>> In a specific manner according to the invention, when there are provided plural sets of non-volatile memory units and buffer units corresponding to each other, an erase unit of the non-volatile memory unit is plural times as large as a write unit and each of the buffer units has a storage capacity on the write unit, the control unit uses both the non-volatile memory unit to be a rewrite object and the buffer unit of a different non-volatile memory unit in a save region of rewrite object storage information corresponding to a directive of a rewrite operation for storage information on the erase unit. Also in the case in which an erase unit for the non-volatile memory unit is greater than a write unit, consequently, the rewrite can be carried out.

<<LSI>> In a specific manner according to the invention, the non-volatile storage device is constituted as a memory LSI formed on one semiconductor chip, a microcomputer LSI formed on one semiconductor chip together with other circuit modules such as a CPU or a system LSI.

[2] <<Independent Access Control>> A non-volatile storage device according to another aspect of the invention comprises a plurality of memory banks (BNK0 to BNK3) and a control unit (CNT), and the memory banks have non-volatile memory units (FARY0 to FARY3) and buffer units (BMRY0 to BMRY3). Accessing object regions of the buffer unit and the non-volatile memory unit are specified based on an address command (20). The control unit can carry out a control upon receipt of a directive (22, 23) of a first access processing between an outside and the buffer unit and a directive (21, 24) of a second access processing between the non-volatile memory unit and the buffer unit from the outside separately from each other. Furthermore, the control unit can control one of the first access processing corresponding to one of the second access processing and can control a plurality of the first access processings corresponding to one of the second access processing.

As described above, the control unit can carry out an access control over the non-volatile memory unit and the buffer unit independently in accordance with directives sent from an outside, respectively. Therefore, the non-volatile memory unit and the buffer unit can be operated in parallel and storage information read once onto the buffer unit can be output at a high speed as in the operation of a cache memory in accordance with a directive sent from the outside.

The control unit is caused to utilize the buffer unit of the memory bank specified in accordance with the address command in the first access processing, and can freely specify the buffer unit in the first access processing. In the second access processing, the control unit is caused to utilize the buffer unit of the memory bank specified in accordance with the address command or the buffer unit of another memory bank corresponding to contents of a directive in the second access processing.

<<Multibank Read>> In a specific manner according to the invention, the control unit controls a read set-up operation for the accessing object region of the non-volatile memory unit specified in accordance with an address command every time the address command is input within a limit of the number of times of a dependence on the number of the memory banks, and controls to read storage information from the non-volatile memory unit subjected to the read set-up and to write the storage information to the buffer unit when a read access command for giving a directive of a read operation as the second access processing is input. Consequently, it is possible to carry out a read operation for a multibank.

<<Multibank Write>> In a specific manner according to the invention, the control unit controls a write operation for write data to the buffer unit of the memory bank specified in accordance with an address command every time the address command is input and write data are input in accordance with a directive of the first access processing continuously within a limit of the number of times of a dependence on the number of the memory banks, and carries out a control to write the write data possessed by the buffer unit to the non-volatile memory unit of the corresponding memory bank when a write access command for giving a directive of the write operation as the second access processing is input. Consequently, it is possible to carry out a write operation for a multibank.

<<Multibank Erase>> In a specific manner according to the invention, the control unit controls an erase operation of a storage region for the non-volatile memory unit of the memory bank specified in accordance with an address command by inputting the address command and then inputting an erase command continuously within a limit of the number of times of a dependence on the number of the memory banks. Consequently, it is possible to carry out an erase operation for a multibank.

[3] <<Independent Access Control>> A non-volatile storage device according to a further aspect of the invention has a control unit, a non-volatile storage unit and a buffer circuit, the non-volatile storage unit being divided into a plurality of non-volatile storage regions, and the buffer circuit being divided into a plurality of buffer regions corresponding to the non-volatile storage regions. The control unit accepts a plurality of operation directive commands from an outside. The operation directive commands have a first operation directive command (22, 23) for giving a directive of an access operation between the buffer circuit and the outside and a second operation directive command (21, 24) for giving a directive of an access operation between the buffer circuit and the non-volatile storage unit. The first operation directive command can give a directive of an access operation to the buffer region, and the second operation directive command can select either an access operation to one of the non-volatile storage region or an access operation to a plurality of the non-volatile storage regions, thereby giving a directive.

The control unit has a command accepting state capable of accepting the operation directive command, and accepts the operation directive command to carry out a processing corresponding to each operation directive command and then brings the command accepting state.

<<Address Command>> In a specific manner according to the invention, the non-volatile storage unit is divided into a plurality of storage regions, the operation directive command has a third operation directive command (20) for specifying an address to select one of the storage regions of the non-volatile storage unit, and the second operation directive command gives a directive to carry out an access operation between the storage region of the non-volatile storage unit which is selected in accordance with the third operation directive command and the buffer circuit.

<<Multibank>> The buffer circuit is divided into a plurality of regions corresponding to the storage regions. At this time, the control unit selects the storage region of the non-volatile storage unit in accordance with the third operation directive command and also selects the region of the buffer circuit corresponding to the storage region of the non-volatile storage unit thus selected. The first operation directive command gives a directive for carrying out an access operation between the region of the buffer circuit selected in accordance with the third operation directive command and the outside. The second operation directive command gives a directive for carrying out an access operation between the region of the buffer circuit and the storage region of the non-volatile storage unit which are selected in accordance with the third operation directive command.

<<Parallelization Processing of Multibank>> The control unit is brought into the command accepting state corresponding to a completion of a part of the access processing to one of the storage regions of the non-volatile storage unit in accordance with the second operation directive command, and before all the access processings to one of the storage regions are completed, can carry out an acceptance of the third operation directive command, and an acceptance of the first or second operation directive command when the buffer circuit region and the storage region of the non-volatile storage unit which are selected in accordance with the third operation directive command are different from the region in which the access processing is carried out.

<<Write/Read Operation Directive Command>> The first operation directive command includes a first write operation command for giving a directive to write data to the buffer circuit and a first read operation command for giving a directive to read data from the buffer circuit, for example. The second operation directive command includes a second write operation command for giving a directive to write data from the buffer circuit to the non-volatile storage unit and a second read operation command for giving a directive to read data from the non-volatile storage unit to the buffer circuit, for example.

<<Erase Operation Directive Command>> The first operation directive command further includes a first erase operation command for giving a directive to erase data written to the buffer circuit. The second operation directive command further includes a second erase operation command for giving a directive to erase data written to the non-volatile storage unit.

<<Command Acceptance parallelized with Erase>> After accepting the third operation directive command for specifying a first storage region of the non-volatile storage unit and then accepting the second erase operation command, and starting to erase data written to the first storage region and before completing the erase of the data, it is possible to accept the third operation directive command for specifying a second storage region of the non-volatile storage unit and the first operation directive command or the second operation directive command.

<<Decision of Write Data over Buffer Circuit>> After accepting the third operation directive command for specifying a first storage region of the non-volatile storage unit and then accepting the second read command, and completing to read data from the non-volatile storage unit to the buffer circuit, it is possible to accept the first operation directive command at least once, and furthermore, to carry out an operation for accepting the second write command.

<parallelization Processing>> After accepting the second read command and before accepting the second write command, it is possible to carry out an acceptance of the third operation directive command for specifying a second storage region of the non-volatile storage unit and an acceptance of the first operation directive command or the second operation directive command at least once and to then carry out an operation for accepting the third operation directive command for specifying the first storage region.

<<Decision of Write Data over Buffer Circuit>> It is possible to carry out an operation for accepting the second write command after accepting the third operation directive command for specifying the first storage region of the non-volatile storage unit and then accepting the first write command at least once. It is possible to carry out an operation for accepting the first operation directive command at least once after accepting the first write command at least once. It is possible to carry out the operation for accepting the second write command at least once after accepting the write command at least once.

<<Cache Operation of Buffer Circuit>> It is possible to accept the second read command after accepting the third operation directive command for specifying a first address included in the first storage region of the non-volatile storage unit, and to read data in a first data volume from an address specified in accordance with the third operation directive command from the non-volatile storage unit to the buffer circuit in accordance with the second read command, and to then accept, at least once, the third operation directive command and the first operation directive command which specify an address included in the first storage region of the non-volatile storage unit and contained in a range of the first data volume from the first address.

<<Cache Operation of Buffer Circuit>> When accepting the second read command after accepting the third operation directive command for specifying a first address included in the first storage region of the non-volatile storage unit, reading data in a first data volume from an address specified in accordance with the third operation directive command from the non-volatile storage unit to the buffer circuit in accordance with the second read command, and further accepting the third operation directive command which specifies a second address included in the first storage region of the non-volatile storage unit and contained in a range of the first data volume from the first address, and accepting the second read command, a read operation from the non-volatile storage unit to the buffer circuit is not carried out in a processing of the second read command.

<<Hold of Storage Information of Buffer Circuit>> Data written to the buffer circuit are not erased in a completion of the second write command but the data written to the buffer circuit are erased in accordance with the first erase operation command.

<<Utilization of Non-Preferential Corresponding Buffer Circuit>> The buffer circuit is divided into a plurality of regions corresponding to the storage regions, and has a first region of a buffer circuit which preferentially corresponds to a first storage region and a second region of a buffer circuit which preferentially corresponds to a second storage region. An access operation can be carried out in the first region of the buffer circuit together with the second storage region. The access operation can also be carried out in the second region of the buffer circuit together with the first storage region.

<<Utilization of Non-Preferential Corresponding Buffer Circuit>> The first operation directive command includes a first write operation command for carrying out an access operation between the first region of the buffer circuit and the outside to give a directive to write data to the buffer circuit, a first read operation command for giving a directive to read data from the buffer circuit, and a first erase operation command for giving a directive to erase data written to the buffer circuit. The second operation directive command includes a second write operation command for carrying out an access operation between the region of the buffer circuit selected in accordance with the third operation directive command and the storage region of the non-volatile storage unit to give a directive to write data from the buffer circuit to the non-volatile storage unit, a second read operation command for giving a directive to read data from the non-volatile storage unit to the buffer circuit, and a second erase operation command for giving a directive to erase data written to the non-volatile storage unit. The second write operation command has a main second write operation command for giving a directive to write data to the storage region which preferentially corresponds to the region of the buffer circuit which is selected, and a subordinate second write operation command for giving a directive to write data to a storage region which is not the storage region preferentially corresponding to the region of the buffer circuit which is selected. The second read operation command has a main second read operation command for giving a directive to read data from the storage region which preferentially corresponds to the region of the buffer circuit which is selected, and a subordinate second read operation command for giving a directive to read data from a storage region which is not the storage region preferentially corresponding to the region of the buffer circuit which is selected.

<<Rewrite Operation>> Data are read or written at a time on a first data volume unit in accordance with the second read command or the second write command. Data are erased at a time on a unit of a second data volume which is larger than the first data volume in accordance with the second erase command. When a first address is to be specified in accordance with the third operation directive command and a directive of the second erase command is to be given, first data included in an address range having the first data volume from the first address are written to the storage region preferentially corresponding to the region of the buffer circuit which is selected or/and second data sent from a second address which is not included in the address range having the first data volume from the first address are written to the storage region which is not the storage region preferentially corresponding to the region of the buffer circuit which is selected.

[4] <<Independent Access Control>> A non-volatile storage device according to a further aspect of the invention has a control unit and a non-volatile storage unit. The non-volatile storage unit has a plurality of storage regions. There are provided the same number of buffer circuits as the number of the storage regions, and the respective buffer circuits are connected to an outside and are caused to correspond to the respective storage regions, and the buffer circuits can be accessed to the outside independently based on a control to be carried out by the control unit, respectively. At least one of the storage regions can carry out an access operation independently together with the corresponding buffer circuit based on the control to be carried out by the control unit.

BRIEF DESCRIPTION OF THE DRAWINGS

FIG. 7 is an explanatory diagram showing a specific example of a command architecture in the flash memory.

DESCRIPTION OF THE PREFERRED EMBODIMENTS

Figure 1:
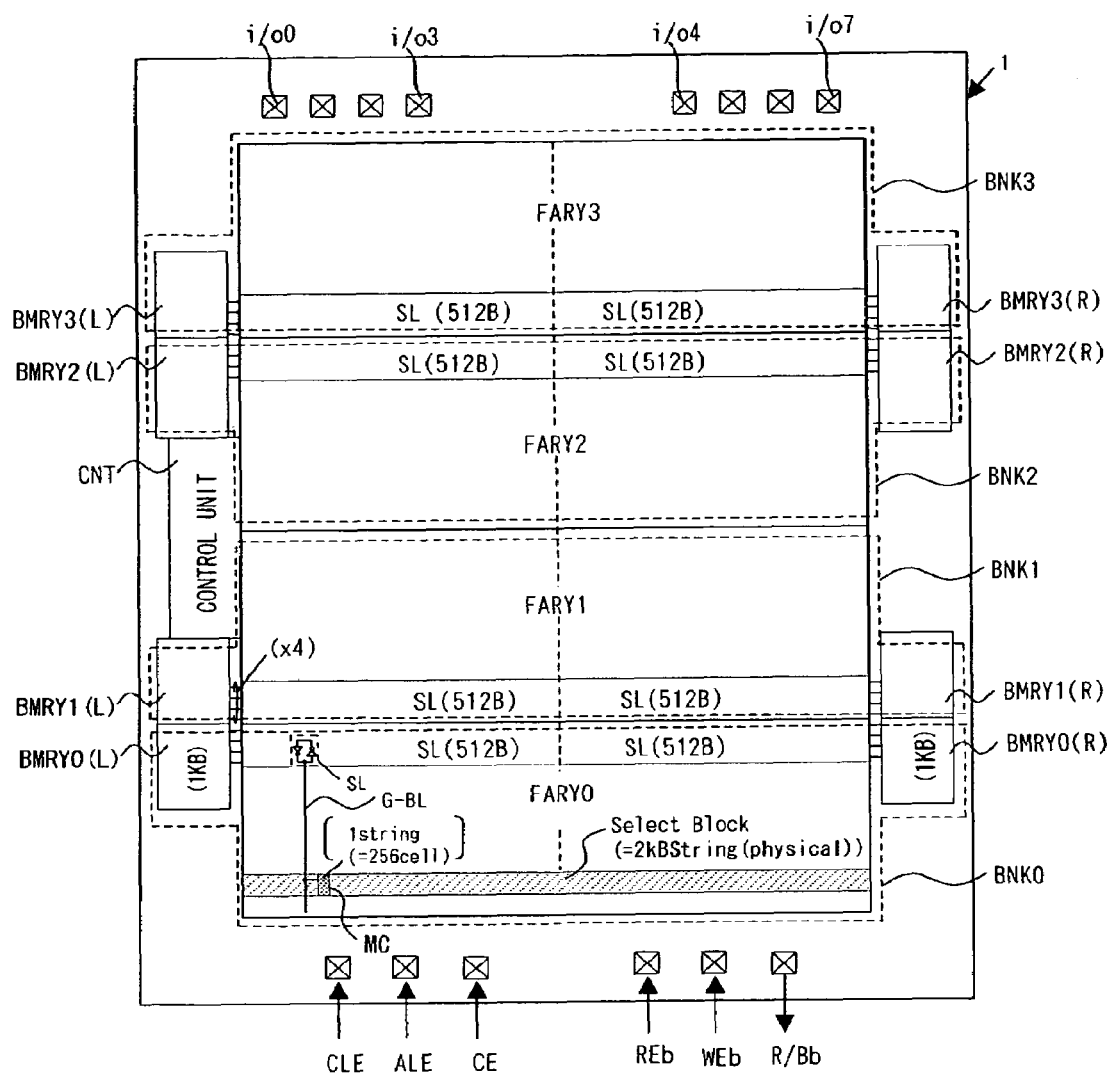
FIG. 1 is a diagram showing the planar layout structure of a flash memory according to an example of a semiconductor storage device according to the invention.

FIG. 1 shows the planar layout structure of a flash memory according to an example of a semiconductor storage device according to the invention. A flash memory 1 shown in FIG. 1 is not particularly restricted but is formed on one semiconductor substrate (chip) such as monocrystalline silicon by a well-known MOS integrated circuit manufacturing method.

The flash memory 1 has four memory banks BNK0 to BNK3 and a control unit CNT, for example. The memory banks BNK0 to BNK3 have flash memory arrays FARY0 to FARY3 to be non-volatile memory units and buffer memories BMRY0 to BMRY3 to be buffer units. The buffer memory is arranged with a transverse division into two parts corresponding to one flash memory array. For convenience, a suffix (R) is attached to the buffer memory on a right side and a suffix (L) is attached to the buffer memory on a left side.

External input/output terminals i/o0 to i/o7 of the flash memory 1 are also used as an address input terminal, a data input terminal, a data output terminal and a command input terminal. The flash memory 1 inputs a command latch enable signal CLE, an address latch enable signal ALE, a chip enable signal CEb, a read enable signal REb and a write enable signal WEb as external control signals, for example, strobe signals and outputs a ready/busy signal R/Bb. The chip enable signal CEb indicates a chip select state for the flash memory 1, the read enable signal REb gives a directive for a read operation from the external input/output terminals i/o0 to i/o7, and the write enable signal WEb gives a directive for a write operation from the external input/output terminals i/o0 to i/o7. The command latch enable signal CLE implies that a command is supplied from an outside to the external input/output terminals i/o0 to i/o7 and the address latch enable signal ALE implies that an address signal is supplied from the outside to the external input/output terminals i/o0 to i/o7. The ready/busy signal R/Bb indicates, with a Low level (L), that an erase, write or read operation is being carried out for any of the flash memory arrays FARY0 to FARY3 (a busy state). It is possible to recognize a busy state or a ready state for each of the flash memory arrays (FARY0 to FARY3) from the outside by reading status information which will be described below.

The control unit CNT controls a signal interface function with the outside corresponding to the state of the strobe signal, and furthermore, controls an internal operation in accordance with an input command.

The respective flash memory arrays FARY0 to FARY3 have a large number of non-volatile memory cells arranged in a matrix. While the non-volatile memory cells are not particularly restricted, one memory cell is constituted by one well-known floating gate type transistor. For example, the non-volatile memory cell is constituted by a source and a drain which are formed in a well region, a floating gate formed through a tunnel oxide film in a channel region between the source and the drain, and a control gate superposed on the floating gate through an interlayer dielectric film. The control gate is connected to a word line, the drain is connected to a bit line and the source is connected to a source line. In FIG. 1, one non-volatile memory cell MC and one bit line G-BL are typically shown, and a sense latch SL constituted by a static latch circuit is connected to one of the ends of the bit line G-BL.

In the flash memory 1 of FIG. 1, 512 bytes of storage information are referred to as one sector. Write and read information storage units are 2048 bytes (=4 sectors) and are referred to as one page. 1024 bytes are also indicated as 1 kilobyte. One page is specified by a page address. Since the flash memory has a field element isolation, an erase information storage unit is set to be a double of the write unit (=4096 bytes) which is referred to as one block. The specification of an even-numbered page address in an erase mode is set to be the specification of a block.

One non-volatile memory cell in the flash memory 1 stores 2-bit information, which is not particularly restricted. In each of the flash memory arrays FARY0 to FARY3, consequently, 2048-byte non-volatile memory cells are connected to one word line, page address information specifies 1024 even-numbered or odd-numbered memory cells to be connected to one corresponding word line, and 1024-byte sense latches SL are arranged in parallel in order to one-to-one correspond to the 1024 memory cells specified by the page address information. The page address information specifies a page address in the whole memory bank, the least significant bit specifies an even or odd number of the page address, a high order thereof specifies the word line, and the most significant 2 bits specify the memory bank. A word line select decoder which is not shown selects the word line, an even/odd bit line selector which is not shown selects a bit line on an even-numbered or odd-numbered page unit, and 1024-byte bit lines selected by the even/odd numbered bit line selector are connected to 1024-byte sense latches SL. In the erase mode, an even-numbered page address is regarded as a block address (an address corresponding to one word line and 2 pages).

The storage data of the non-volatile memory cell utilize that the threshold voltage of the memory cell is changed corresponding to an amount of electric charges stored in the floating gate. At this time, the threshold voltage of the memory cell is limited to a desirable range corresponding to the value of the storage data and a threshold voltage distribution thereof is referred to as a memory threshold distribution. For instance, one non-volatile memory cell stores 2-bit information in this example and four kinds of memory threshold voltage distributions corresponding to "01, 00, 10, 11" data of the storage information are determined. More specifically, the information storage state of one memory cell is selected from an erase state ("11") to be a fourth threshold voltage (Vth4), a first write state ("10") to be a first threshold voltage (Vth1), a second write state ("00") to be a second threshold voltage (Vth2), and a third write state ("01") to be a third threshold voltage (Vth3). The threshold voltage has a relationship of Vth4<Vth1<Vth2<Vth3, which is not particularly limited. Four information storage states in total are determined by 2-bit data. In order to obtain the memory threshold distribution, a write verify voltage to be applied to the word line during a write operation after the erase is set to be three kinds of voltages which are different from each other, and these three kinds of voltages are sequentially changed over to carry out the write operation in a division to three times. In each of the three write operations, 0V is applied to a write select bit line and 1V is applied to a non-select bit line. For example, the word line is set to be 17V, which is not particularly restricted. When the time required for applying a high write voltage is prolonged, the threshold voltage of the memory cell is raised. Three kinds of write threshold voltages can be controlled by the control of a time in such a high-voltage state, and furthermore, the level control of a high voltage to be applied to the word line. Whether 0V or 1V is applied to the bit line is determined by the logical value of write control information to be latched to the sense latch circuit SL. For example, the latch data of the sense latch circuit SL are controlled to be write non-select with a logical value of "1" and write select with a logical value of "0". Whether "1" or "0" is set to the sense latch SL during the write operation is determined in accordance with write data on the buffer memory by the control unit CNT corresponding to the write threshold voltage state in which the write is to be carried out. In a block batch erase, a select word line is set to −16V, a non-select word line is set to 0V, and a select bit line is set to 2V. Referring to the read of the storage information, three kinds of voltages to be a word line select level to be applied to the word line are set, a read operation is carried out three times at a maximum while the three kinds of word line select levels are sequentially changed, and 2-bit storage information is decided based on a binary (1-bit) value read from the memory cell in each read operation.

The control unit CNT controls the erase, write and read for the flash memory arrays FARY0 to FARY3.

The buffer memories BMRY0 to BMRY3 are constituted by an SRAM (Static Random Access Memory), for example, and write data input in a binary from the outside to the external input/output terminals i/o0 to i/o7 and read data in a binary output from the external input/output terminals i/o0 to i/o7 are stored temporarily. The buffer memories BMRY0 to BMRY3 are divided into two parts for each memory bank and the buffer memories BMRY0 to BMRY3 for each memory bank have minimum storage capacities which are equal to the write unit and the read unit in the respective corresponding flash memory arrays. For example, in case of the flash memory 1, the write information unit and the read information unit are one page (=2 Kbytes). For this reason, the respective buffer memories BMRY0 to BMRY3 to be on-chip buffers have a 2-Kbyte storage capacity. As described above, a set of buffer memories BMRY0 to BMRY3 is arranged in each memory bank, and the buffer memory provided in the same memory bank is utilized preferentially corresponding to the same flash memory array. In some cases, a buffer memory which is not caused to preferentially correspond is utilized depending on an operation mode. The control is carried out by the control unit CNT in accordance with a command and an address signal.

A data input/output between the flash memory array and the buffer memory is carried out on an 8-bit unit. In the flash memory arrays FARY0 to FARY3, a sense latch selecting circuit which is not shown selects the sense latch SL on the 8-bit unit. The buffer memories BMRY0 to BMRY3 can be accessed on the 8-bit unit. A data transfer between the flash memory arrays FARY0 to FARY3 and the buffer memories BMRY0 to BMRY3 and an access control for the buffer memories BMRY0 to BMRY3 are carried out by the control unit CNT based on a command and access address information which are given from the outside.

Figure 2:
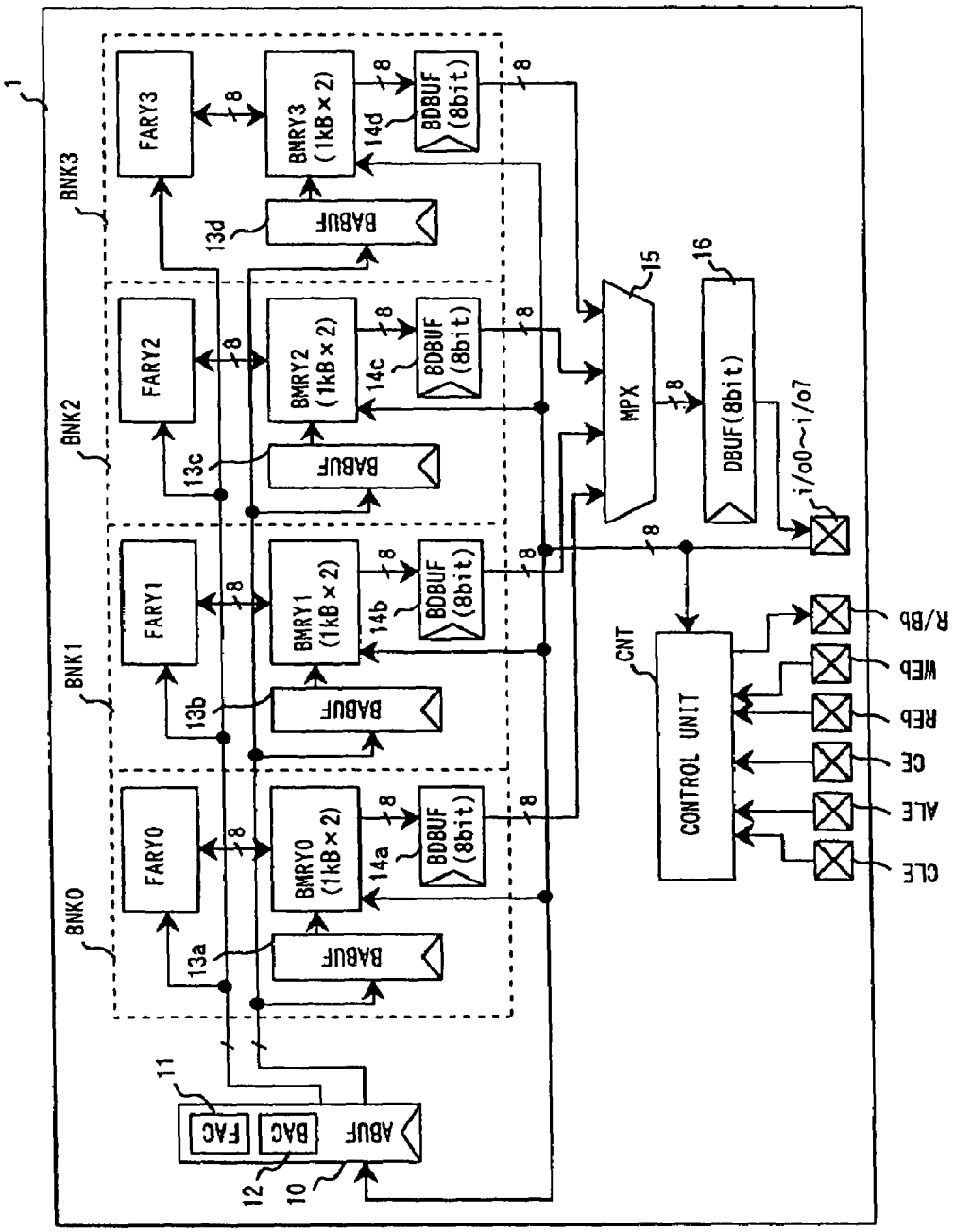
FIG. 2 is a block diagram illustrating the details of transmitting paths for an address, data and a command code in a flash memory 1.

FIG. 2 illustrates the details of transmitting paths for an address, data and a command code in the flash memory 1. The command codes supplied to the external input/output terminals i/o0 to i/o7 are input to the control unit CNT.

External address information given to the external input/output terminals i/o0 to i/o7 are supplied to an address buffer (ABUF) 10. The address information input to the address buffer 10 include page address information for specifying the page address of the flash memory array in all the memory banks BNK0 to BNK3 and access head address information (buffer head column address information) of the buffer memory, and the address information are latched to an address latch circuit which is not shown. The address buffer has a flash address counter (FAC) 11 and a buffer address counter (BAC) 12. The address counter 11 is an address counter for generating an address signal to sequentially select a sense latch corresponding to one page on a byte unit. The buffer address counter 12 is an address counter for presetting buffer head column address information (which will also be referred to as a column address) and for sequentially generating the access address signal of a buffer memory on an 8-bit unit by setting a preset value or a counter reset value as an initial value. The page address information and the output of the flash address counter 11 are supplied to the flash memory arrays FARY0 to FARY3. The output of the buffer address counter 12 is supplied to address buffers (buffer unit address buffer=BABUF) 13a to 13d of the buffer memories BMRY0 to BMRY3. The same output is supplied to the buffer memories BMRY0 to BMRY3 therefrom.

Write data given to the external input/output terminals i/o0 to i/o7 are sent to one buffer memory BMRYi (i=0 to 3) in the buffer memories BMRY0 to BMRY3. The data read from the buffer memory BMRYi are output from the external input/output terminals i/o0 to i/o7 to the outside through data buffers (buffer unit data buffer=BDBUF) 14a to 14d of the corresponding buffer memory BMRYi, a data multiplexer (MPX) 15, and a data buffer (DBUF) 16.

Data are input/output on the 8-bit unit between the buffer memories BMRY0 to BMRY3 and the flash memory arrays FARY0 to FARY3.

Figure 3:
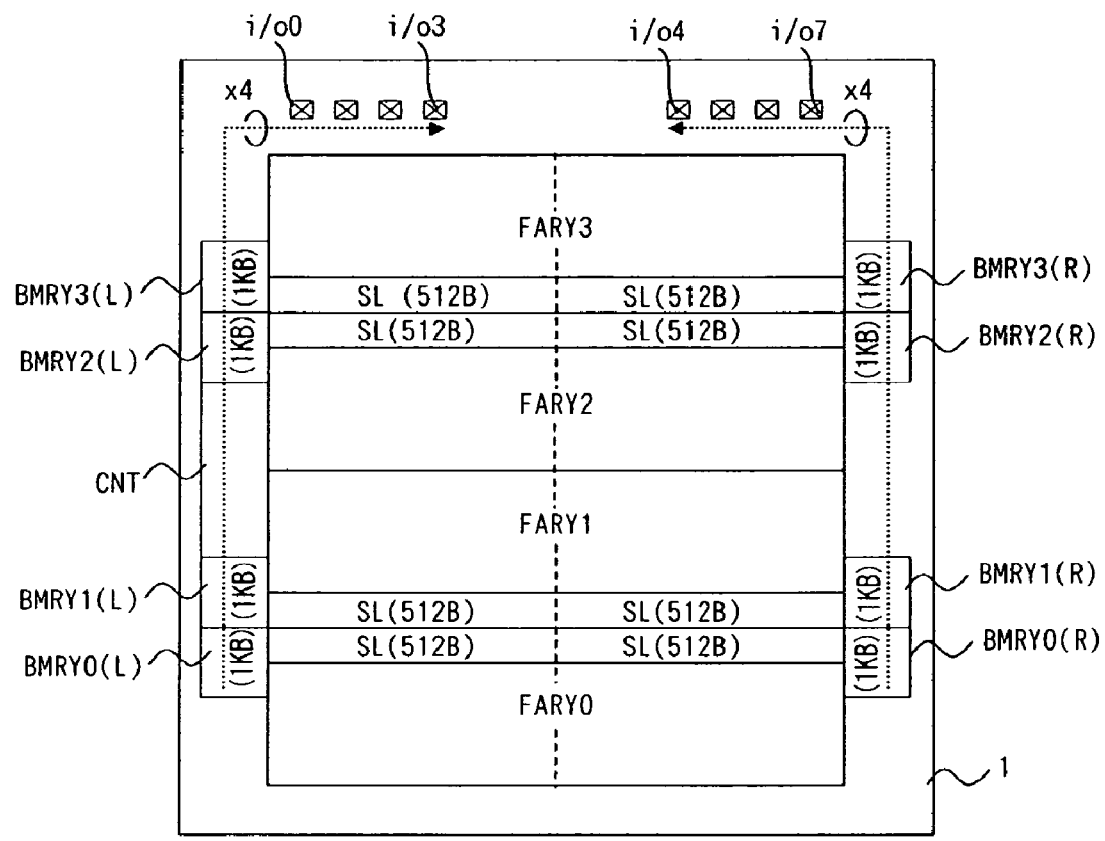
FIG. 3 is an explanatory diagram illustrating a data transfer configuration between external input/output terminals i/o0 to i/o7 and a buffer memory.

FIG. 3 illustrates a data transfer configuration between the external input/output terminals i/o0 to i/o7 and the buffer memory BMRYi (i=0 to 3). In a read operation for the flash memory 1, the buffer memory BMRYi for temporarily holding the storage information of the flash memory array FARYi selected based on page address information is interfaced with the external input/output terminals i/o0 to i/o7, and particularly, a buffer memory BMRYi(L) on a left side in one buffer memory BMRYi selected based on the page address information is interfaced with the external input/output terminals i/o0 to i/o3 and a buffer memory BMRYi(R) on a right side in one buffer memory BMRYi selected based on the page address information is interfaced with the external input/output terminals i/o4 to i/o7 so that the storage information are read to the outside. In a write operation for the flash memory 1, moreover, write data to be given to the external input/output terminals i/o0 to i/o3 are temporarily held in the buffer memory BMRYi(L) on the left side in one buffer memory BMRYi selected based on the page address information, and write data to be given to the external input/output terminals i/o4 to i/o7 are temporarily held in the buffer memory BMRYi(R) on the right side in one buffer memory BMRYi selected based on the page address information.

Figure 4:
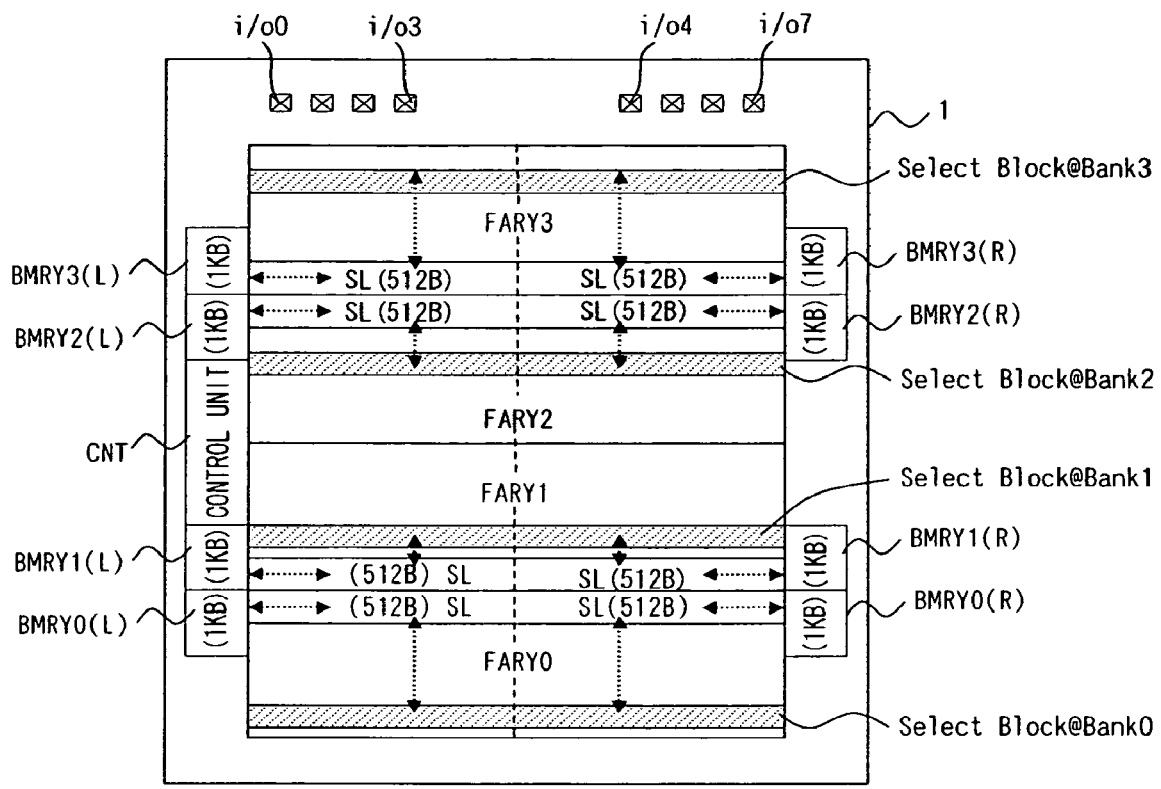
FIG. 4 is an explanatory diagram illustrating a data transfer configuration between a buffer memory and a flash.

FIG. 4 illustrates a data transfer configuration between the buffer memory BMRYi and the flash FARYi. In an access operation for the flash memory 1, write information to be held temporarily in the buffer memory BMRYi specified based on the page address information is written to the flash memory array FARYi specified based on the page address information in a write operation for specifying a memory bank BNKi. In an access operation for the flash memory 1, moreover, storage information sent from the flash memory array FARYi specified based on the page address information is temporarily held in the buffer memory BMRYi specified based on the page address information in a read operation for specifying the memory bank BNKi.

Figure 5:
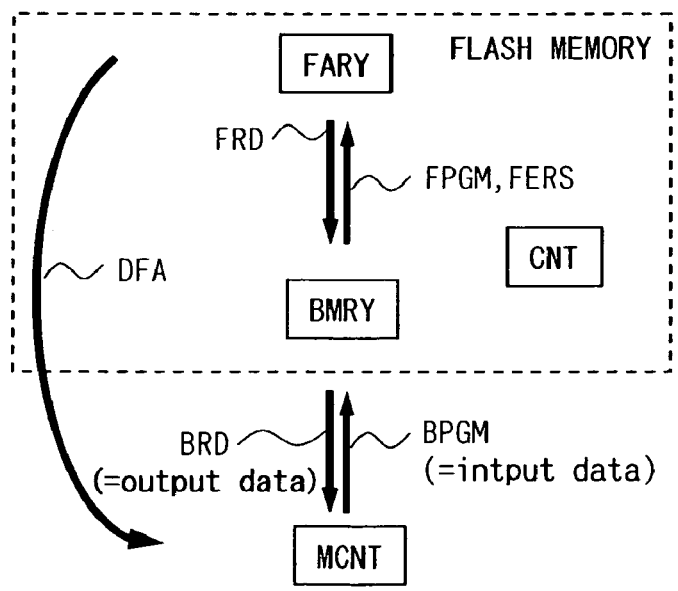
FIG. 5 is an explanatory diagram illustrating the type of an access processing in the flash memory.

FIG. 5 illustrates the type of an access processing in the flash memory 1. FARY is generally referred to as the flash memory arrays FARY0 to FARY3. BMRY is generally referred to as the buffer memories BMRY0 to BMRY3. MCNT represents a flash memory controller to be provided on the outside of the flash memory 1. The control unit CNT can separately control a first access processing between the outside and the buffer memory BMRY and a second access processing between the flash memory array FARY and the buffer memory BMRY upon receipt of directives from the outside, respectively. The first access processing is roughly divided into a buffer program processing BPGM for writing data from the outside to the buffer memory BMRY and a buffer read processing BRD for reading data from the buffer memory BMRY to the outside. The second access processing is roughly divided into a flash program processing FPGM for writing the storage information of the buffer memory BMRY to the predetermined area of the flash memory array FARY, a flash erase processing FERS for erasing the predetermined area of the flash memory array FARY, and a flash read processing FRD for reading the storage information of the predetermined area of the flash memory array FARY and causing the buffer memory BMRY to hold the same storage information. In addition, for a third access processing, the control unit CNT controls a direct flash access processing DFA for directly reading the storage information of the predetermined area of the flash memory array as binary information to the outside. "Direct" implies that a conversion processing between a binary and a 4-value for the storage information is not carried out.

Figure 6:
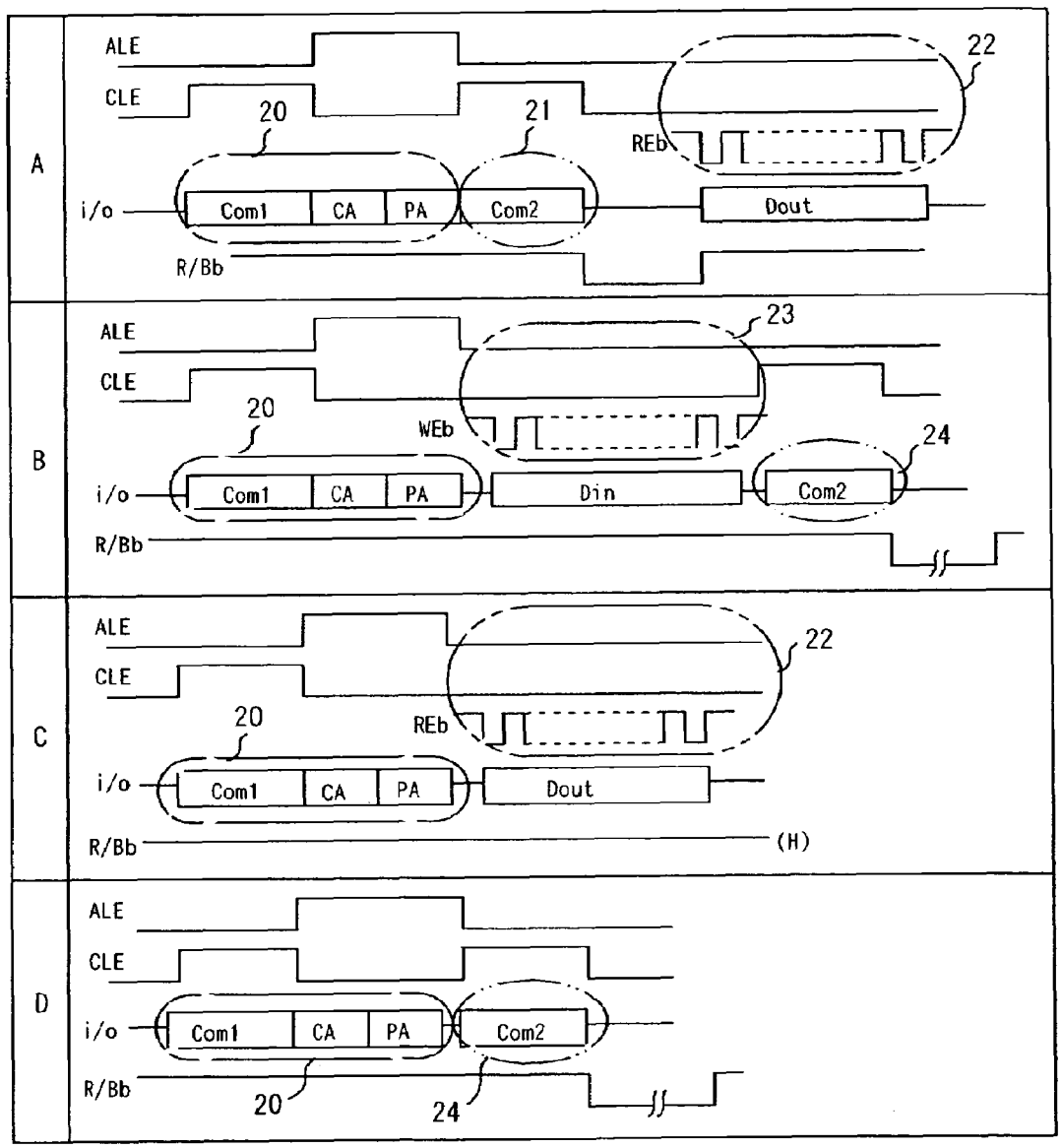
FIG. 6 is an explanatory diagram schematically illustrating directive configurations for a first access processing and a second access processing.

FIG. 6 schematically illustrates the directive configurations of the first access processing and the second access processing.

In FIG. 6, 20 generally denotes an address command, Com1 generally denotes a first command code such as an address command code, CA represents the buffer head column address information, and PA represents page address information. 21 generally denotes an access command for giving a directive for the flash read processing as the second access processing. Com2 represents a second command code constituting an access command. In a column A of FIG. 6, 22 denotes the directive of the buffer read processing BRD as the first access processing. The directive of the buffer read processing BRD is given in a read enable state (REb=L) in a command latch disable (CLE=L) and address latch disable (ALE=L) status, for example. A state in which the storage information to be an object of the flash read processing FRD indicated by the access command 21 is specified by the page address information and is completely transferred from the flash memory array FARYi to the buffer memory BMRYi is indicated in a ready state (R/Bb=L) to be a first state of the ready/busy signal R/Bb to the outside of the flash memory 1. A directive 22 of the buffer read processing BRD is given from the outside after waiting for the ready state of the ready/busy signal R/Bb. When the directive 22 of the buffer read processing BRD is given, the data specified based on the buffer head column address information are output from the buffer memory BMRYi to the outside synchronously with a change in the clock of the read enable signal REb. The output data are shown as Dout.

In a column B of FIG. 6, 23 denotes the directive of the buffer program processing BPGM as the first access processing. The directive 23 of the buffer program processing BPGM is given in a write enable state (WEb=L) in a command latch disable (CLE=L) and address latch disable (ALE=L) status, for example. When the directive 23 of the buffer store processing BPGM is given, input data Din are sequentially stored synchronously with a change in the clock of the write enable signal WEb by setting, as a head address, the buffer head column address information in the buffer memory BMRYi of the memory bank BNKi specified by the page address information. 24 generally denotes an access command for giving the directive of the flash program processing FPGM as the second access processing. When the directive of the flash program processing FPGM is given, the storage information of the buffer memory BMRYi is written to the page address of the flash memory array FARYi specified by the page address information. The ready/busy signal R/Bb is brought into a busy state until the write operation is completed.

In a column C of FIG. 6, the access command 21 for giving the directive of the flash read processing FRD to be the second access processing in the column A of FIG. 6 is omitted and the directive of the buffer read processing BRD to be the first access processing is given immediately after the address command 20 (22). In the directive configuration of the access processing, data Dout are sequentially output synchronously with a change in the clock of the read enable signal REb by setting the buffer head column address information to be a head address from the buffer memory BMRYi in the memory bank BNKi determined in accordance with the page address information of the address command 20. At this time, the directive of the second access processing 21 is not given. For this reason, an access to the flash memory array FARYi is not carried out. In the case in which the data held in the buffer memory BMRYi are to be read out, there is not brought the busy state until the data transfer from the flash memory array FARYi to the buffer memory BMRYi is completed as in the column A. Consequently, the external output operation timing of data to be read is quickened.

In a column D of FIG. 6, the directive 23 of the buffer store processing BPGM to be the first access processing in the column B of FIG. 6 is omitted and the directive 24 of the flash program processing FPGM to be the second access processing is given immediately after the address command. In the directive configuration of the access processing, the storage information of the buffer memory BMRYi in the memory bank BNKi determined in accordance with the page address information of the address command 20 is written to the page of the flash memory array FARYi specified by the page address information. At this time, the directive of the first access processing 23 is not given. For this reason, it is not necessary to receive the supply of the write data from the outside to the buffer memory BMRYi. In the case in which the data held in the buffer memory BMRYi are to be written to the flash memory array FARYi, it is not necessary to receive the transfer of the write data from the outside as in the column B. Therefore, it is possible to shorten a period required for completing the write to the flash memory array FARYi.

Figure 8:
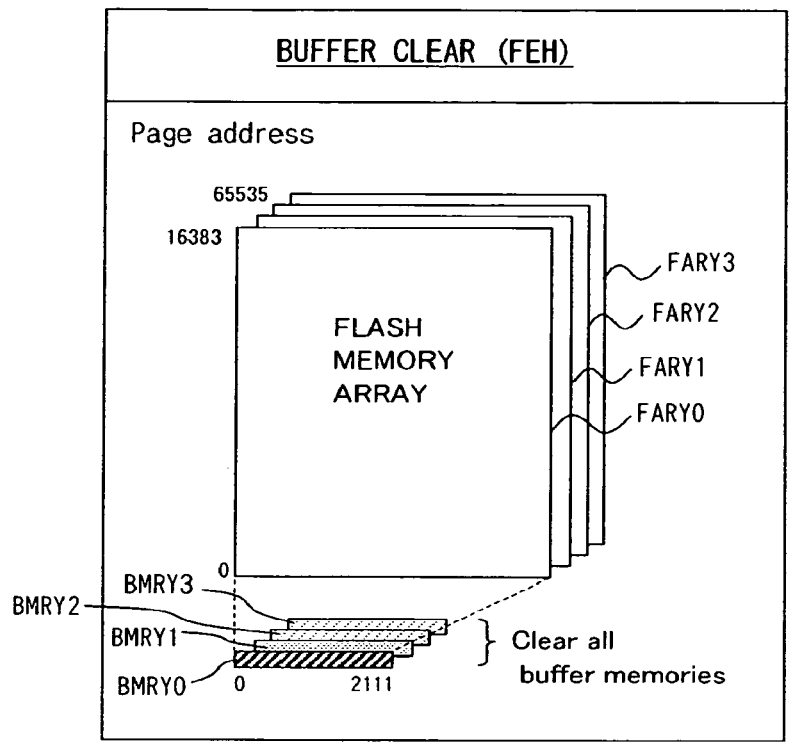
FIG. 8 is an explanatory diagram showing an operation, typically illustrating the contents of a clear processing based on a buffer clear command.

FIG. 7 shows a specific example of a command architecture in the flash memory 1. An address command code is illustrated in a column of Com 1 and an access command code is illustrated in a column of Com2. In the flash memory 1, clear for the buffer memory BMRYi is carried out expressly. In order to execute the processings described in the C and D columns of FIG. 6, significant data are to remain in the buffer memory BMRYi. The reason is that the foregoing is to be guaranteed. For example, a buffer clear command of No. 22 is executed to clear the storage information in all the buffer memories BMRY0 to BMRY3. A command code "FEH" of Com1 in the buffer clear command gives the directive of a buffer clear operation. FIG. 8 typically shows the contents of a clear processing in accordance with the buffer clear command.

When the Com1 is accompanied by an address command code "80H" in FIG. 7, the clear processing is previously carried out for the buffer memory determined based on page address information PA and a data transfer processing is then started. When the address command having 80H as a head is continuously given, the clear processing is carried out for only a first time. When the Com1 is accompanied by an address command code "00H", the clear processing is not carried out.

Figure 9:
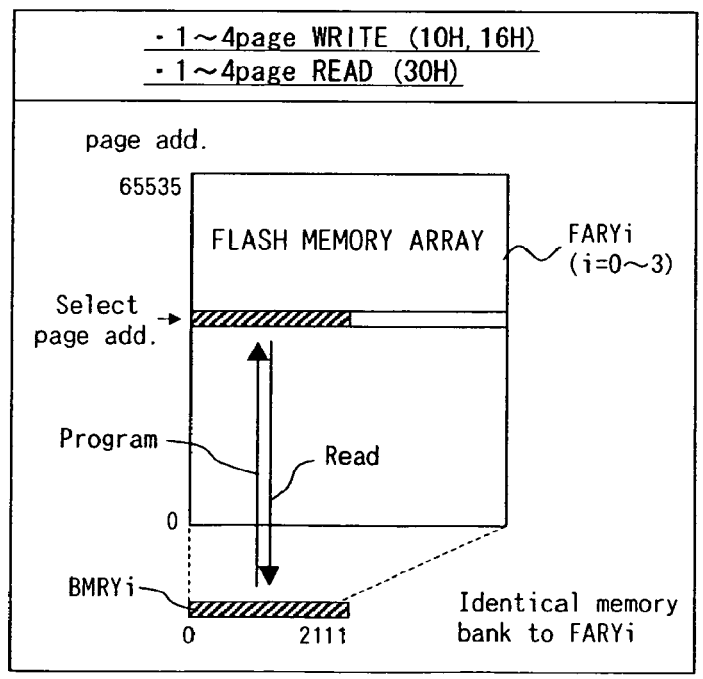
FIG. 9 is an explanatory diagram showing an operation, typically illustrating the contents of a write or read processing for any of pages 1 to 4.

In FIG. 7, a command code of basic write for the flash memory array is set to be "10H" and "16H" and a command code for basic read for the flash memory array is set to be "30H". The write or read based on the command codes is optional within a range of 1 to 4 pages. For the page address information required for the write or read of a plurality of pages, it is preferable that the address commands setting "00H" and "80H" to be heads should be repeated at plural times. It is preferable that the necessary write data for writing a plurality of pages should be input in accordance with the directive of the first access processing every time the page address information is input, for example. While the external read of the storage information transferred from the flash memory array FARYi to the buffer memory BMRYi is preferably carried out in accordance with the directive of the first access processing, it is also possible to perform the external read of the data with the optional column address of the buffer memory to be a starting point by utilizing random access commands illustrated in command Nos. 2 and 3 in FIG. 7 when the storage information of the pages are to be sequentially read from the buffer memories BMRYi. The optional column address to be the starting point is specified by the CA and the buffer head column address information thus specified are preset to the buffer address counter 12 in FIG. 2 and are sequentially updated. FIG. 9 typically shows the contents of the write or read processing for any of the 1 to 4 pages.

Figure 10:
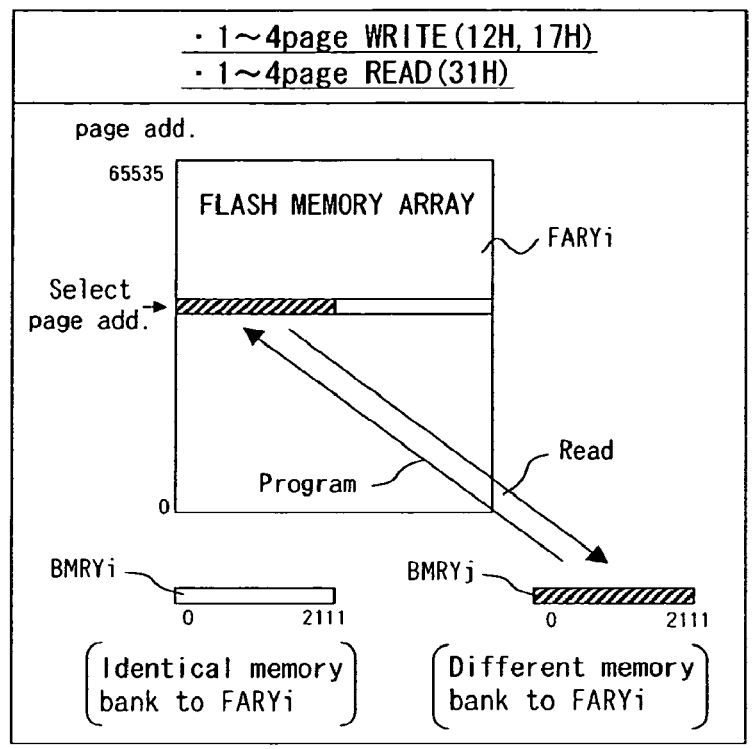
FIG. 10 is an explanatory diagram illustrating a preferential correspondence relationship and a non-preferential correspondence relationship of the buffer memory for a flash memory array.

In the write or read processing, the buffer memory is caused to preferentially correspond to the flash memory array of the same bank. More specifically, when the memory bank BNKi is specified with the page address information in a preferential correspondence relationship, the specification is regarded as the specification of the flash memory array FARYi and the buffer memory BMRYi in the same bank. The presence of the preferential correspondence relationship is not particularly restricted but is determined with the command code of the access command. In FIG. 7, a non-preferential correspondence relationship is selected in case of access command codes "31H", "12H" and "17H" of the Com 2 and the preferential correspondence relationship is selected in the other cases. Referring to the non-preferential correspondence relationship, similarly, a correspondence relationship between the flash memory arrays FARY0 to FARY3 and the buffer memories BMRY0 to BMRY3 is predetermined. More specifically, the flash memory arrays FARY0, FARY1, FARY2 and FARY3 are caused to non-preferentially correspond to the buffer memories BMRY2, BMRY3, BMRY0 and BMRY1. FIG. 10 illustrates the preferential and non-preferential correspondence relationships of the buffer memory with the flash memory array.

The connection of the buffer memory having the preferential correspondence relationship with the flash memory array and the connection of the buffer memory having the non-preferential correspondence relationship with the flash memory array can be selected by a change-over switch for exclusively changing over the mutual connections, which is not particularly shown.

Figure 11:
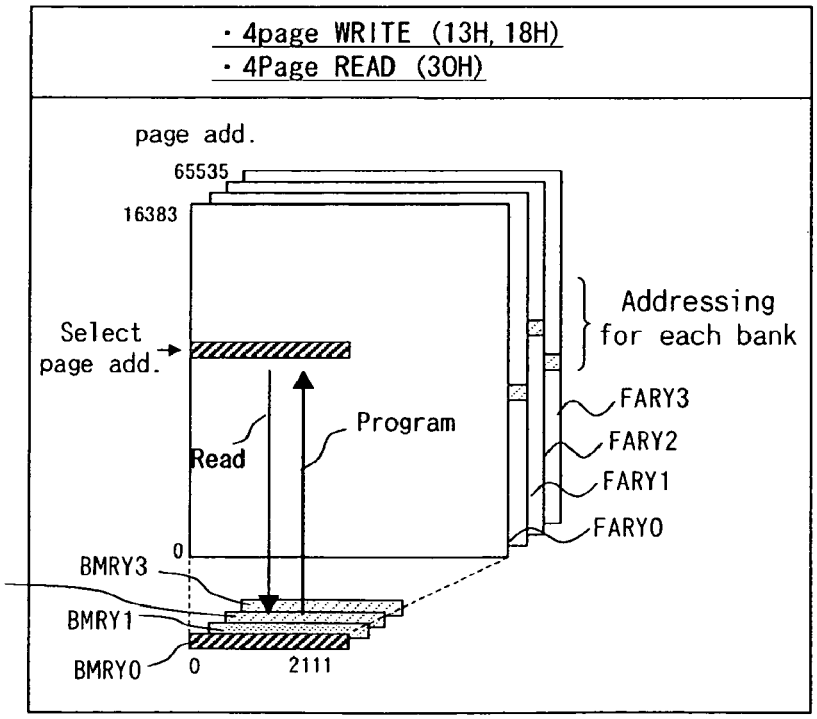
FIG. 11 is an explanatory diagram typically showing the contents of a 4-page write or read processing.

In the write or read operation for the flash memory array, particularly, a dedicated access command is prepared for the operation of a 4-page specification. An access command code for a 4-page write is "13H" and "18H" and an access command code for a 4-page read is "30H". FIG. 11 typically shows the contents of the 4-page write or read processing.

Figure 12:
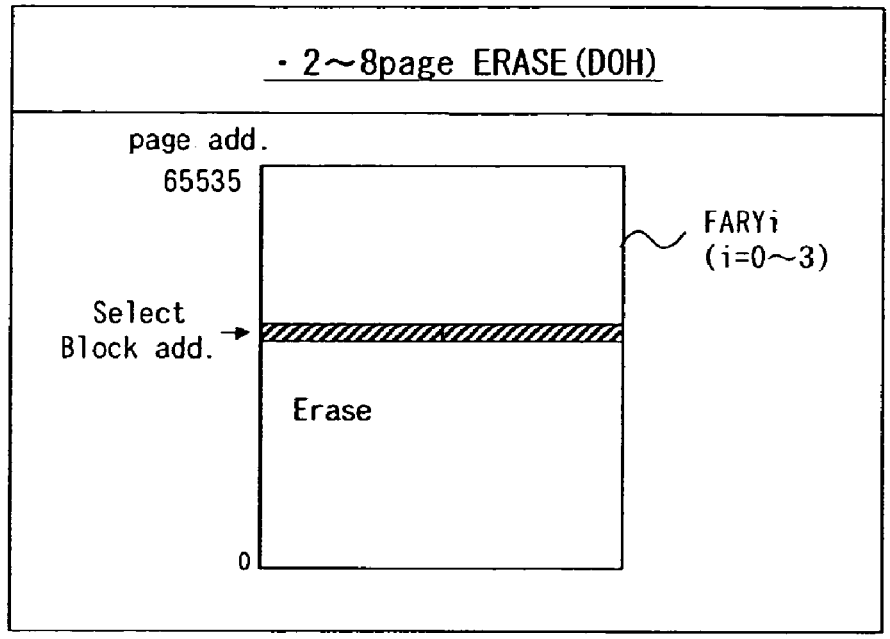
FIG. 12 is an explanatory diagram typically showing the contents of an erase processing for any of pages 2 to 8.

In FIG. 7, the basic command code of an erase for the flash memory array is set to be "D 0H". The directive of a parallel erase can be given up to 8 pages at a maximum on a 2-page unit. The erase based on the command code is set to be optional within a range of 2 to 8 pages. For the necessary page address information for the erase of a plurality of pages, it is preferable that an address command having "60H" to be a head should be repeated at plural times. FIG. 12 typically shows the contents of an erase processing for any of the 2 to 8 pages.

Figure 13:
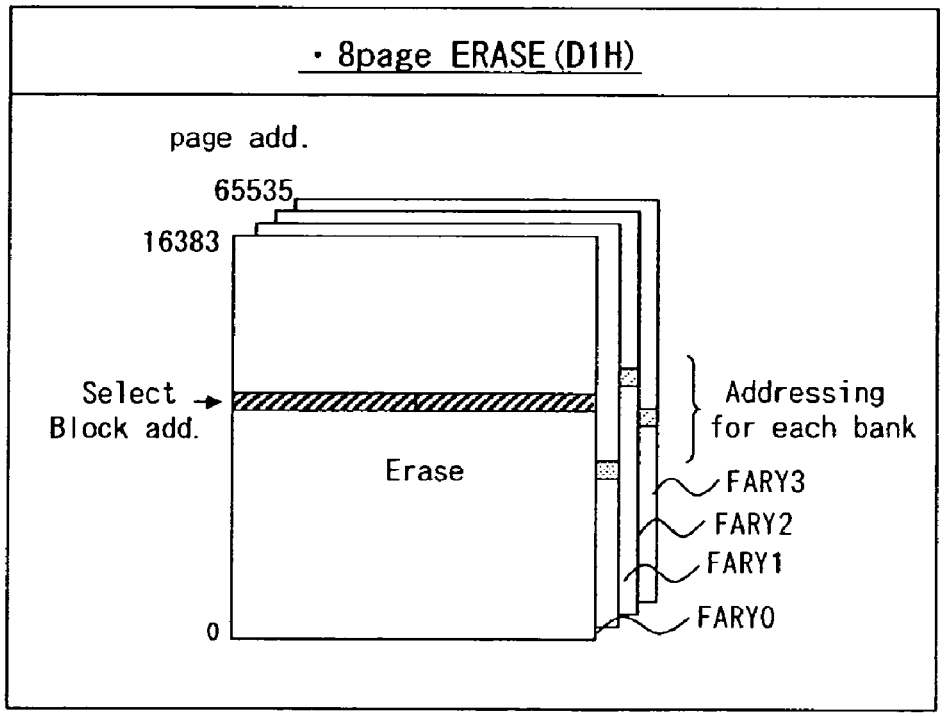
FIG. 13 is an explanatory diagram typically showing the contents of an 8-page erase processing.

In the erase operation for the flash memory array, particularly, a dedicated access command is prepared for an 8-page specifying operation. The access command code of the 8-page erase is "D1H". FIG. 13 typically shows the contents of the 8-page erase processing.

Figure 14:
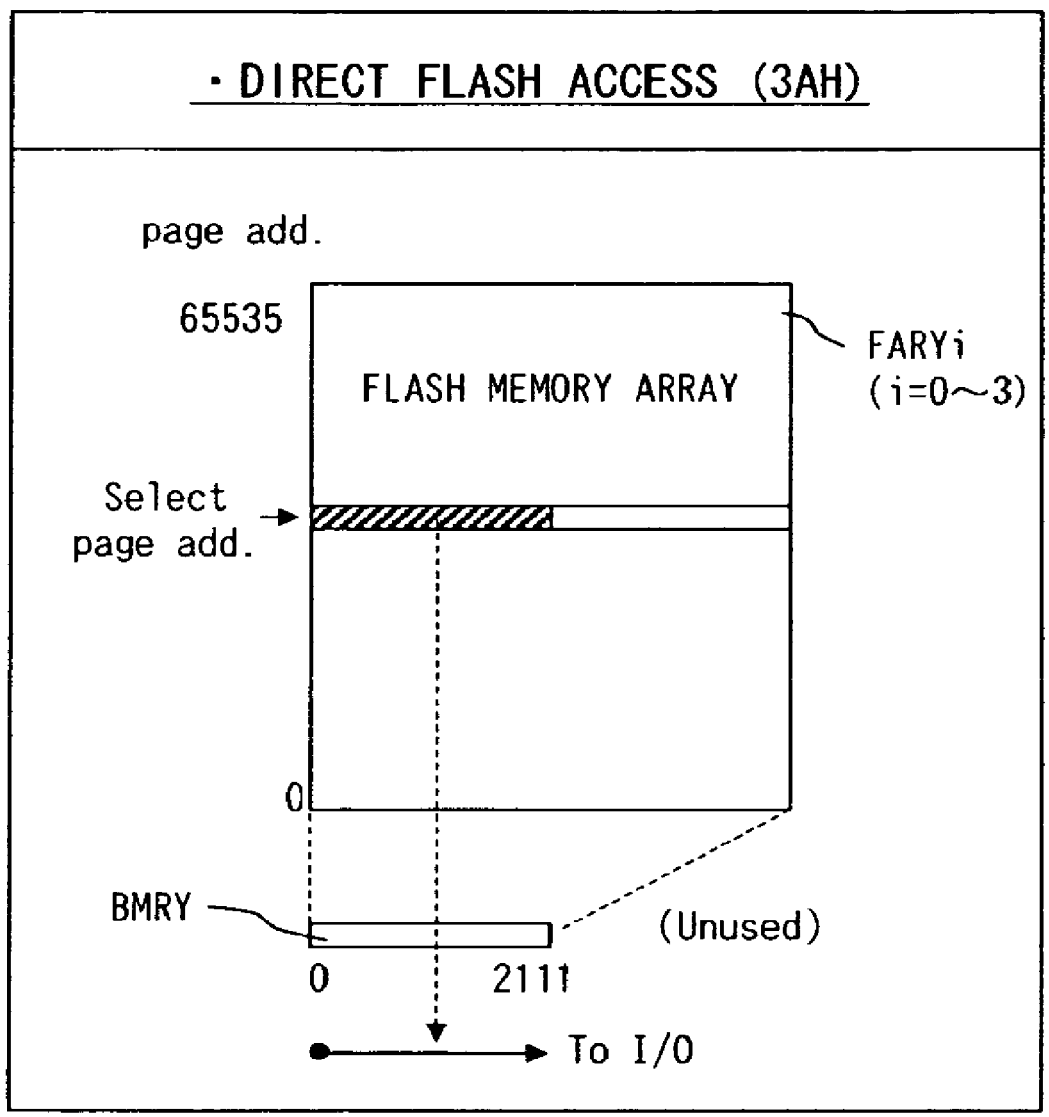
FIG. 14 is an explanatory diagram typically showing the contents of a direct flash access processing.

In FIG. 7, a command No. 20 is a direct flash access command (a binary read command) and 2-bit storage information which is stored in one memory cell is read as 1-bit storage information. FIG. 14 typically shows the contents of a direct flash access processing.

The flash memory 1 has status information for each flash memory array FARYi in a status register and the status information can be read to the outside based on a command code 7*H (70H to 76H) of the Com 1 in FIG. 7. In brief, it is possible to grasp a ready state and a busy state for each flash memory array FARYi, and furthermore, a state of write pass/fail on an outside. In the flash memory 1, consequently, it is possible to easily give the directive of an access processing for the memory bank which is not operated or the directive of the first processing for the memory bank BNKi during an erase operation.

Figure 15:
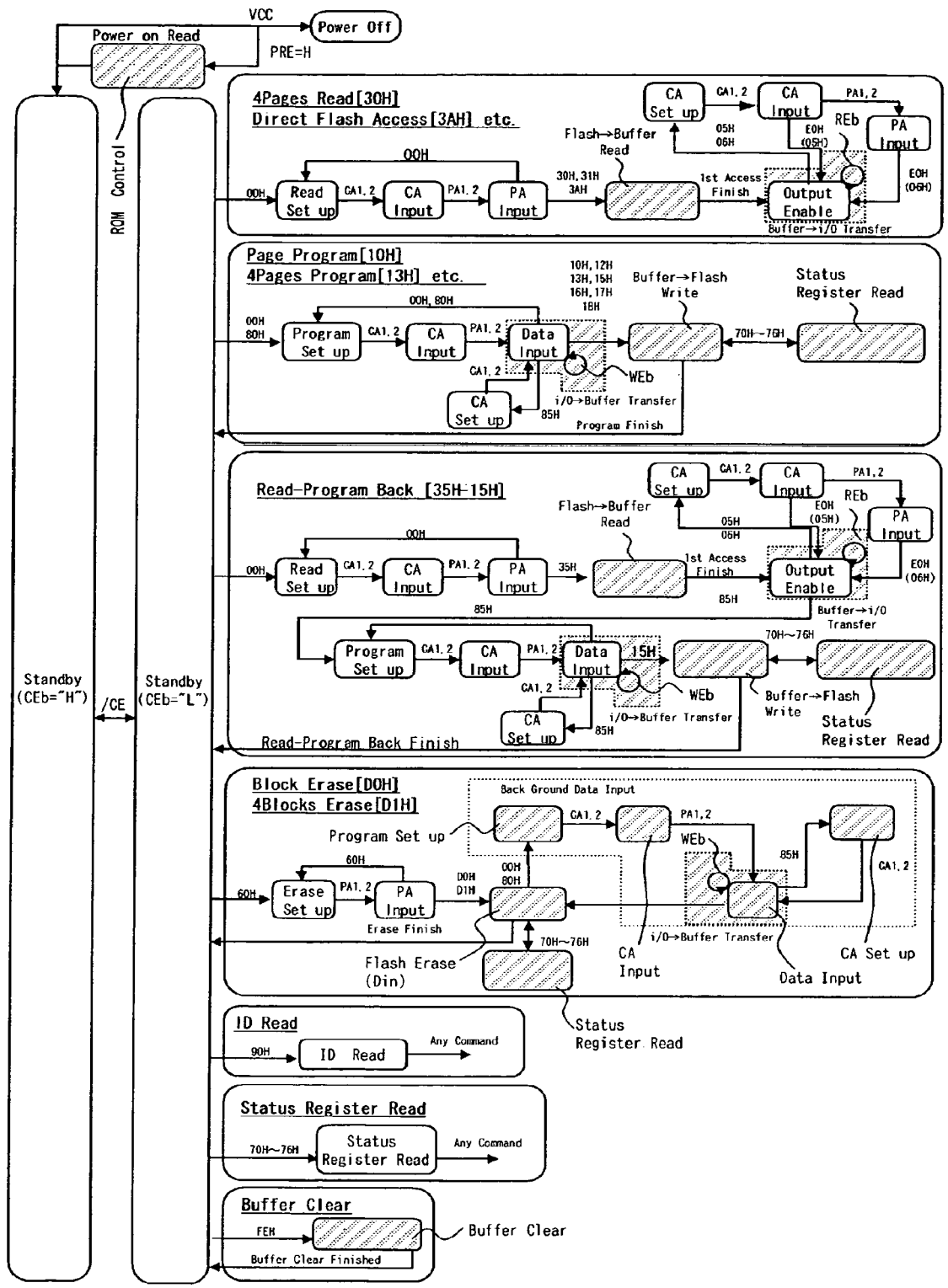
FIG. 15 is a state transition diagram showing a control state for responding to an address command and the directives of first and second access processings.

FIG. 15 is a state transition diagram illustrating a control responding to the address command and the directives of the first and second access processings. The state transition control is set to be the control contents of the control unit CNT. A control state shown in hatching in FIG. 15 is brought into a busy state.

Description will be given to a read operation control (4 Page Read [30H]). The address of a read page is specified by using an address command (addressing command) code "00H". An address is specified in order of CA and PA. By using a flash system read command 30H (31H, 3AH), next, the data of a memory cell specified in accordance with the address command are transferred to the buffer memory BMRYi to be an on-chip buffer corresponding to a selected page. A status during a transfer is set to be busy. After the execution of the flash system read command is completed, the storage information of the buffer memory BMRYi is output to the outside synchronously with a change in the read enable signal REb. In the case in which a plurality of pages is intended for the read, it is preferable to repeat the address command "00H". After an operation (Flash→Buffer) for reading the storage information from the flash memory array to the buffer memory BMRYi is completed, the storage information of the buffer memory BMRYi is output from the head to the outside synchronously when the clock of the read enable signal REb is changed. When the command code of No. 2 or No. 3 in FIG. 7 is put in before the change in the clock of the read enable signal REb, data having, as a head, a column address specified by the CA can be output.

Description will be given to a write operation control (Page Program [10H]). The address of a page to be written is specified by using an addressing command "80H" or "00H". The address is input in order of CA and PA. Then, write data are input from the outside to the buffer memory BMRYi corresponding to a selected page synchronously with a change in the clock of the write enable signal WEb. When the input of the write data from the outside is completed, the write data on the buffer memory BMRYi are transferred to the page specified in accordance with the address command by using a flash system write command 10H or 12H. A status during the transfer is set to be busy. After the write is ended, a status code can be confirmed by using a command such as 70H.

Description will be given to a rewrite operation control (Read-Program Back [35H-15H(10H)]). The data on a page address are read from the flash memory array FARYi to the buffer memory BMRYi in accordance with the address command "00H" and an access command "35H", and the column address of data to be rewritten on the buffer memory BMRYi is then specified in accordance with the buffer head column address information of the CA incidental to an address command "85H" and data on the column address thus specified are input to the buffer memory BMRYi. Thereafter, the data of the buffer memory BMRYi are written back to the page address of the flash memory array FARYi in accordance with an access command "15H". Consequently, it is possible to carry out a rewrite to the optional region of the flash memory array FARYi.

Description will be given to an erase operation control (Block Erase [D0H], 4 Block Erase [D1H]). The address of a block to be erased is specified by using an addressing command 60H. In the case in which a plurality of blocks is to be erased, the processing is repeated. The address specifies the PA and is converted to a block address in a chip. By using a flash system erase command D0H or D1H, next, the block specified in accordance with the address command is erased. A status during the erase is set to be busy. After the erase is ended, a status code is confirmed by using a command such as 70H. Moreover, data can be input/output between the buffer memory which is not utilized and the outside simultaneously with the execution of the flash system erase command such as D0H (a background data access).

Description will be given to a binary read operation (a direct flash access) (Direct Flash Access [3AH]). In the case in which an access command code "3AH" of the buffer memory is specified, 2-bit storage information stored in one memory cell is read as 1-bit storage information. More specifically, the storage of information in the memory cell intended for the direct flash access is selected from two states including an erase state and a third write state having the highest threshold voltage in consideration of a read operation margin taken to be great. In the read operation, the threshold voltage between the erase state and the third write state is set to be a read word line voltage, and storage information thus read is exactly used as read data for binary storage information.

Description will be given to a clear command (Buffer Clear). In a clear command code "FEH", all the buffer memories BMRY0 to BMRY3 are cleared in a batch. Herein, "clear" implies that all storage information are set to have a logical value of "0", which is not particularly restricted. In the flash memory arrays FARY0 to FARY3, write data having the logical value of "0" are assumed to have a logical value for a write inhibition. By preparing the clear commands of the buffer memories BMRY0 to BMRY3, it is possible to carry out a write with random data input in a page (an additional write) at a high speed. In the case in which the additional write is to be carried out, it is necessary to input dummy data (a pattern having the logical value of "0") which implies a write inhibition to a region in which the write is not carried out if there are no clear commands of the buffer memories BMRY0 to BMRY3. Then, it is necessary to change the clock of the write enable signal WEb on the write unit. On the other hand, if there are the clear commands of the buffer memories BMRY0 to BMRY3, the dummy data representing the write inhibition are set onto the buffer memories BMRY0 to BMRY3 when the buffer memories BMRY0 to BMRY3 are cleared. Therefore, the write enable signal WEb may be clocked corresponding to a data size on the write unit.

Next, the access operation of the flash memory 1 will be generally described.

Figure 16:
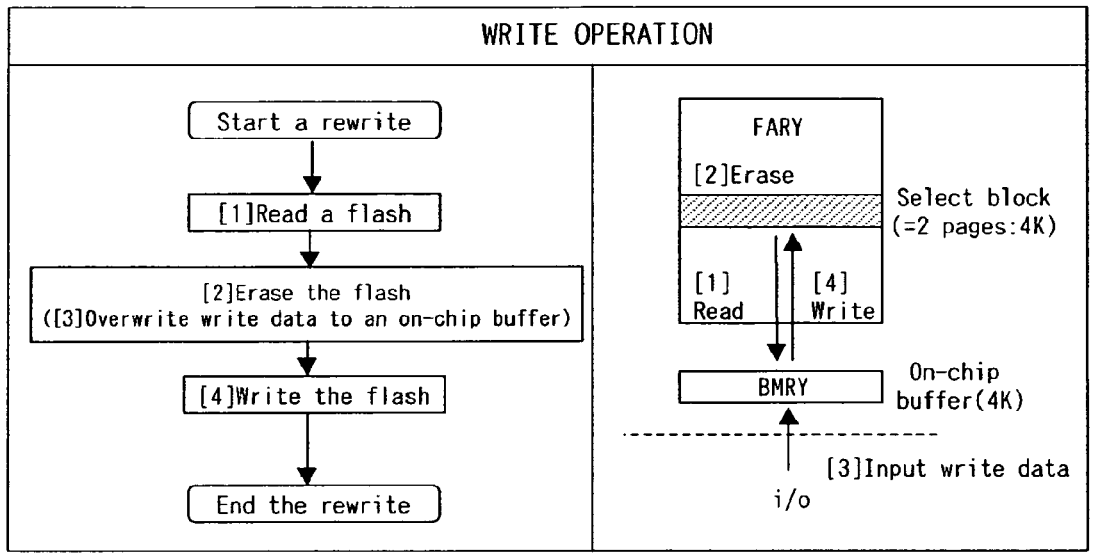
FIG. 16 is an explanatory diagram showing a rewrite operation for the flash memory.

FIG. 16 shows a rewrite operation for the flash memory. A data flow is shown on a right side and an operation procedure is shown on a left side. Herein, a rewrite on an erase unit (2 pages=4 Kbytes) is supposed and two buffer memories BMRY corresponding to the erase unit will be referred to as an on-chip buffer (4K). In a processing [1], memory cell data are transferred to the on-chip buffer (4K) in accordance with a read command (flash system). In a processing [2], a memory cell is erased in accordance with an erase command (flash system). In a processing [3], write data are overwritten to the on-chip buffer (4K) simultaneously with the operation in the processing [2] (buffer system). In a processing [4], after the processings [2] and [3] are ended, the data of the on-chip buffer are subsequently transferred to the memory cell in accordance with a write command (flash system).

Figure 17:
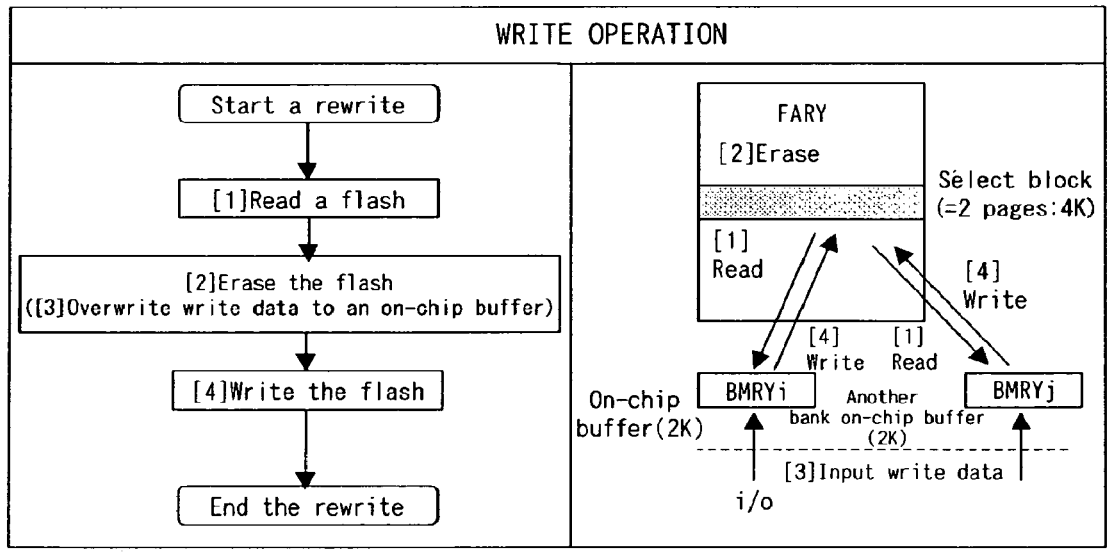
FIG. 17 is an explanatory diagram showing a rewrite operation utilizing, for a data save, a corresponding buffer memory and a non-corresponding buffer memory in a memory bank.

The on-chip buffer (4K) corresponds to two buffer memories BMRYi and BMRYj in the buffer memories BMRY0 to BMRY3 in FIG. 1. In FIG. 17, this respect is made clear and a rewrite operation for the flash memory is shown.

In FIG. 17, the memory cell data (=4 Kbytes) are transferred to the on-chip buffers BMRYi and BMRYj in accordance with a read command (flash system) in a processing [1]. At this time, the data are also saved in the buffer memory (=2 Kbytes) BMRYj of a non-select memory bank together with the corresponding buffer memory (=2 Kbytes) BMRYi of a select memory bank. In a processing [2], the memory cell is erased in accordance with an erase command (flash system). In a processing [3], write data are overwritten to the on-chip buffer memories BMRYi and BMRYj simultaneously with the operation in the processing [2] (buffer system). In a processing [4], after the processings [2] and [3] are ended, the data of the on-chip buffer memories BMRYi and BMRYj are subsequently transferred to the memory cell in accordance with a write command (flash system).

Figure 18:
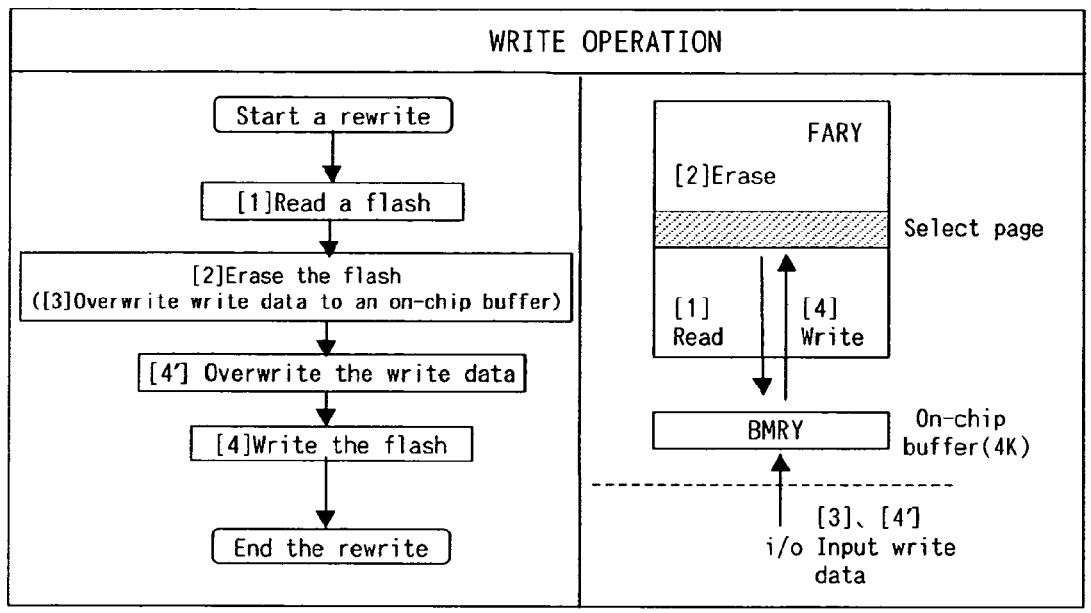
FIG. 18 is an explanatory diagram showing another rewrite operation for the flash memory.

FIG. 18 shows another rewrite operation for the flash memory. A data flow is shown on a right side and an operation procedure is shown on a left side. Herein, a rewrite on an erase unit (2 pages=4 Kbytes) is supposed and the buffer memory BMRY corresponding to the erase unit will be referred to as an on-chip buffer (4K). Herein, the data are rewritten at necessary number of times over the buffer memory and a write to the flash memory array is thus carried out (=Read-Program Back mode). More specifically, in a processing [1], memory cell data are transferred to the on-chip buffer BMRY in accordance with a read command (flash system). In a processing [2], a memory cell is erased in accordance with an erase command (flash system). In a processing [3], write data are overwritten to the on-chip buffer BMRY simultaneously with the operation in the processing [2] (buffer system). In a processing [4'], the write data thus changed are overwritten to the on-chip buffer memory BMRY again. The buffer system command is executed at a speed which is almost ten times as high as the speed of the flash system command. For this reason, an operation for simply executing the buffer system command positively utilizes only the buffer system command. It is also possible to carry out the write in the processing [4] at any time which is required. In a processing [5], the power supply of a chip is turned off or the data of the on-chip buffer BMRY are transferred to the memory cell in accordance with a write command (flash system) before a next addressing command is input. There is no frequency limit for the change of the buffer data (=buffer data write) to be carried out during the operations [1] to [5]. It is possible to execute the change of the buffer data if necessary.

Figure 19:
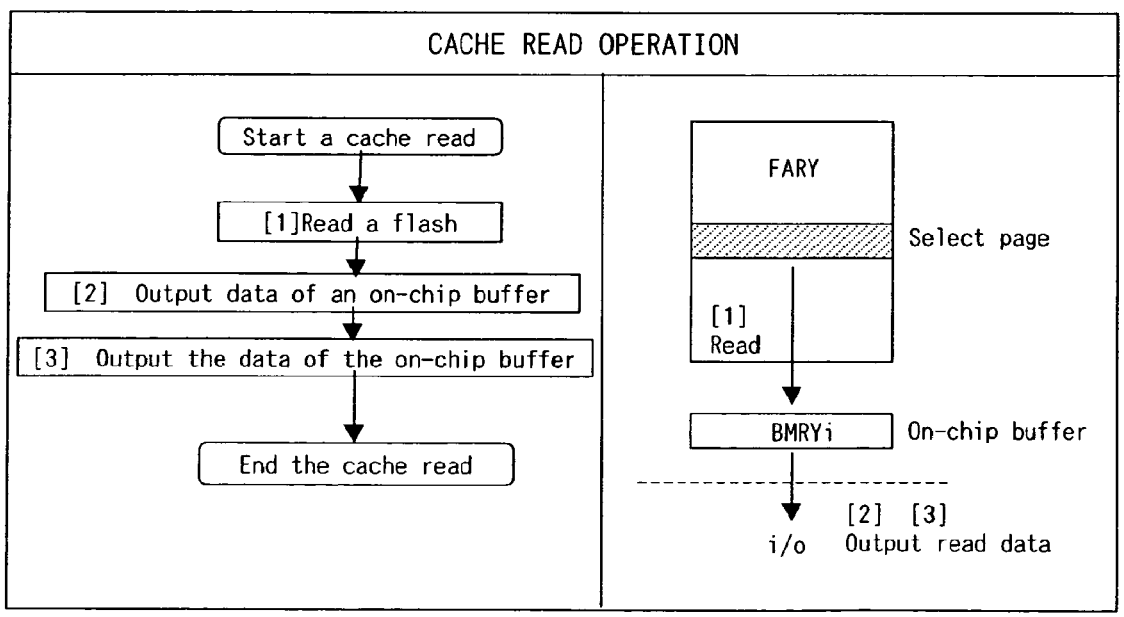
FIG. 19 is an explanatory diagram showing a cache read operation for the flash memory.

FIG. 19 shows a cache read operation for the flash memory. A data flow is shown on a right side and an operation procedure is shown on a left side. Herein, a read is carried out on a page unit (=2 Kbytes) and the on-chip buffer to be the buffer memory BMRYi receives the read data on a page unit. In a processing [1], the memory cell data are transferred to the on-chip buffer BMRYi in accordance with a read command (flash system). In a processing [2], subsequently, the data of the on-chip buffer are read from i/o to the outside synchronously with a change in the clock of the read enable signal REb. In a processing [3], in the case in which the same page is to be continuously read out, data on the on-chip buffer BMRYi are exactly output from the i/o to the outside synchronously with the change in the clock of the read enable signal REb without using the flash system read command. This processing can be executed many times until the data on the on-chip buffer BMRYi are rewritten. At this time, when whether a page address specified in accordance with an address command is coincident (page address hit) or non-coincident (page address miss hit) with the page address of the data on the on-chip buffer BMRYi is decided at a flash memory controller MCNT side on the outside of the flash memory, it is unnecessary to carry out status polling for obtaining the result of the decision. In brief, a memory controller itself to be an access request source recognizes the state of the page address hit or the page address miss hit, thereby giving an access request. For this reason, it is not necessary to wait for the memory controller to recognize, through the polling, a state in which the data output timing of the flash memory is varied depending on the page address hit or the page address miss hit.

Figure 20:
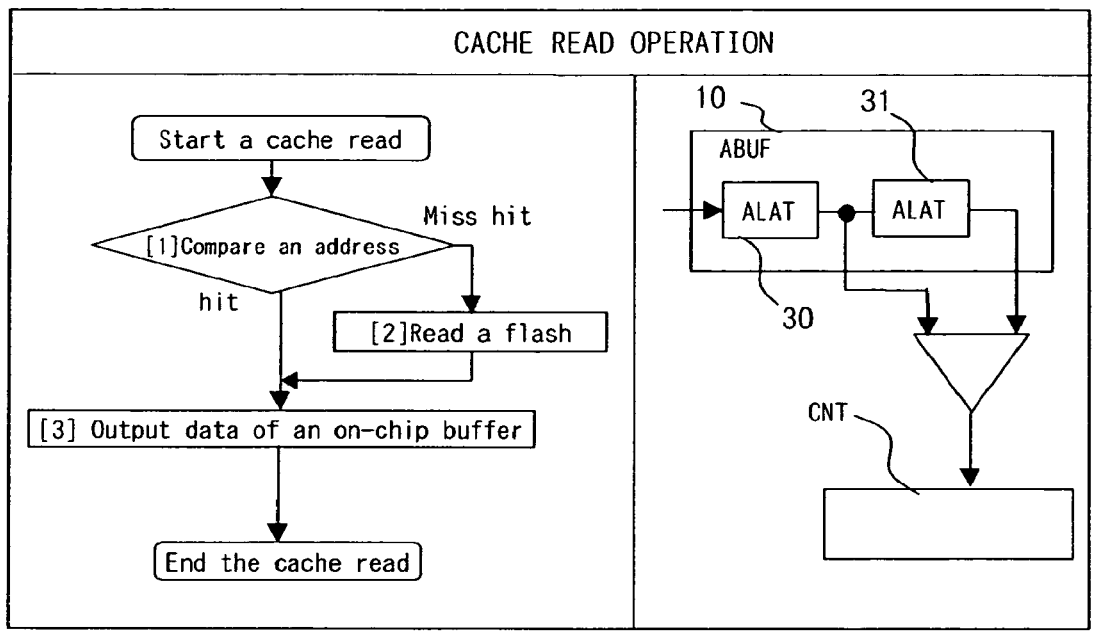
FIG. 20 is an explanatory diagram showing an example of the case in which the decision of a page address hit and a page address miss hit for the cache read operation for the flash memory is carried out by the flash memory.

FIG. 20 shows an example of the case in which the decision of the page address hit and the page address miss hit for the cache read operation in the flash memory is carried out by the flash memory. A hardware structure for the decision is illustrated on a right side and a control procedure thereof is illustrated on a left side.

Address latch circuits 30 and 31 for holding respective page address information in an access to be carried out twice before and after are prepared for the address buffer (ABUF) 10 in FIG. 2. The first address latch circuit 30 stores page address information which is being operated, and the second address latch circuit 31 stores page address information about the last operated access. In a processing [1], when a command (flash system) for reading the memory cell data is input, the value of the first address latch circuit 30 and that of the second address latch circuit 31 are compared with each other by a comparing circuit 32. The result of the comparison is given to the control unit CNT. The control circuit CNT returns the ready/busy signal R/Bb (or status) into the ready state without carrying out the data read operation for the flash memory array FARYi when the values of the address latch circuits 30 and 31 are coincident with each other (a processing [3]) so that the data of the buffer memory BMRYi can be output. Subsequently, the value of the first address latch circuit 30 is copied onto the second address latch circuit 31.

In the case in which the values of the address latch circuits 30 and 31 are not coincident with each other, the memory cell data of the flash memory array FARYi are transferred to the on-chip buffer BMRYi (a processing [2]). During the transfer, the busy state is set. Subsequently, the value of the first address latch circuit 30 is copied onto the second address latch circuit 31.

During the comparing and deciding operation, an external flash memory controller FCNT carries out the status polling. When the ready state is confirmed in response to the ready/busy signal R/Bb, the clock of the read enable signal REb is changed to output data from the on-chip buffer memory BMRYi to the i/o.

Figure 21:
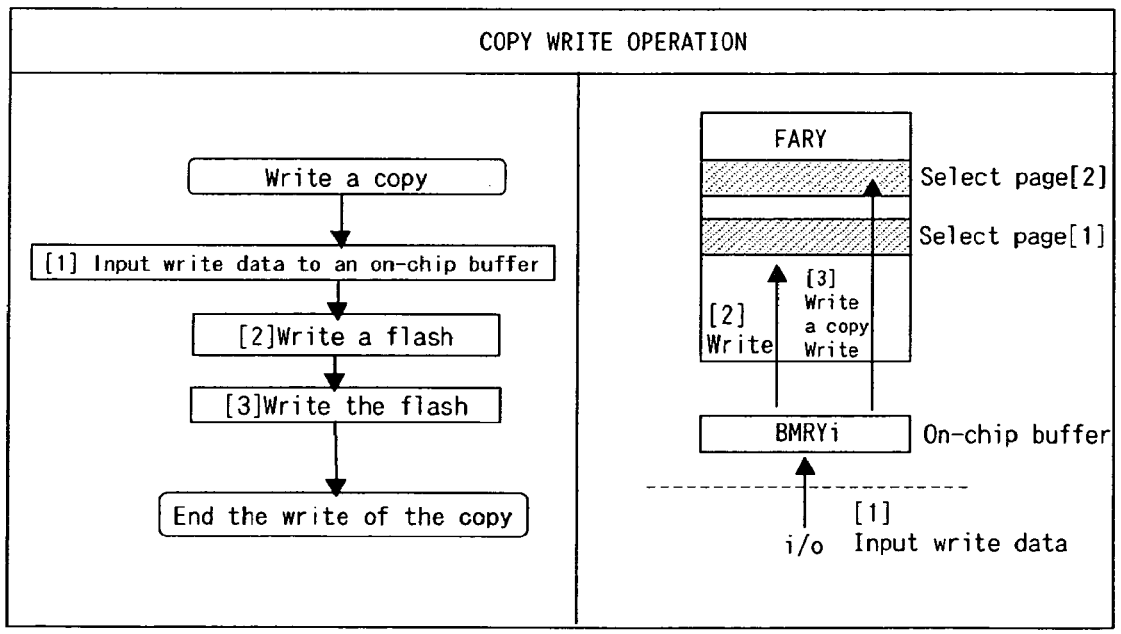
FIG. 21 is an explanatory diagram illustrating a copy write operation.

FIG. 21 illustrates a copy write operation. A data flow is shown on a right side and an operation procedure is shown on a left side. Herein, a write is carried out on a page unit (=2 Kbytes) and the on-chip buffer to be the buffer memory BMRYi gives write data to the flash memory array FARYi on the page unit. An operation shown in FIG. 21 is used for a write error processing or data write multiplexing. In a processing [1], write data are written to the on-chip buffer BMRYi (buffer system command). In a processing [2], subsequently, the data of the on-chip buffer BMRYi are transferred to the flash memory array FARYi in accordance with a write command (a flash system command). In a processing [3], in the case in which the same data are to be written to a different page from the page selected in the processing [2] (in brief, a copy is to be carried out), the page address of a copy destination is specified in accordance with an addressing command and the data of the on-chip buffer BMRYi are transferred to the memory cell in accordance with a write command (flash system) again. This processing can be executed many times until the data on the on-chip buffer BMRYi are rewritten.

Next, the access operation timing of the flash memory 1 will be generally described.

Figure 22:
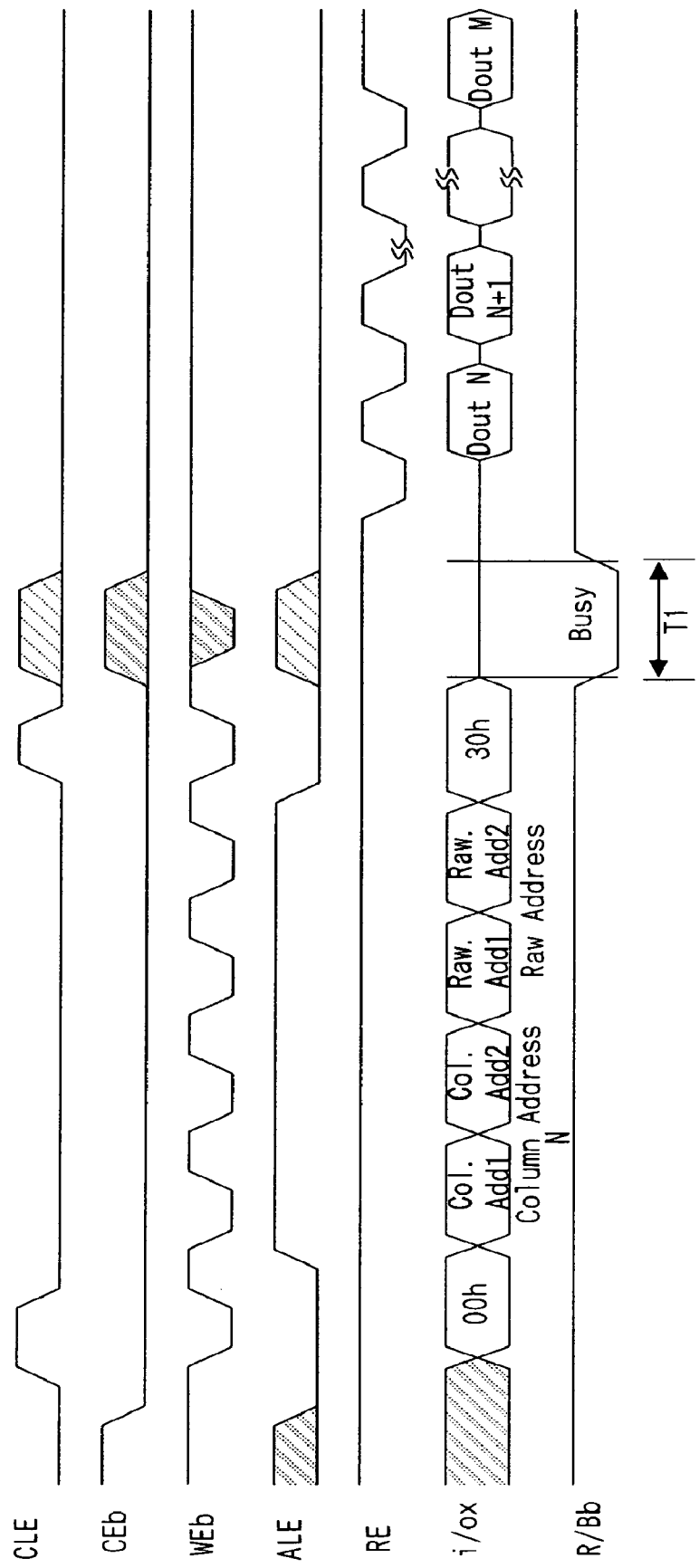
FIG. 22 is a timing chart showing a read operation.

FIG. 22 illustrates a read operation timing. This corresponds to the case of the command configuration in the column A of FIG. 6, and furthermore, corresponds to a read operation through the processings [1] and [2] of FIG. 19. In FIG. 22, Col.Add1 and Col.Add2 correspond to CA and Raw.Add1 and Raw.Add2 correspond to PA. A time T1 in FIG. 22 is equivalent to an operation time from the read of data from the flash memory array FARYi to a transmission to the buffer memory BMRYi.

Figure 23:
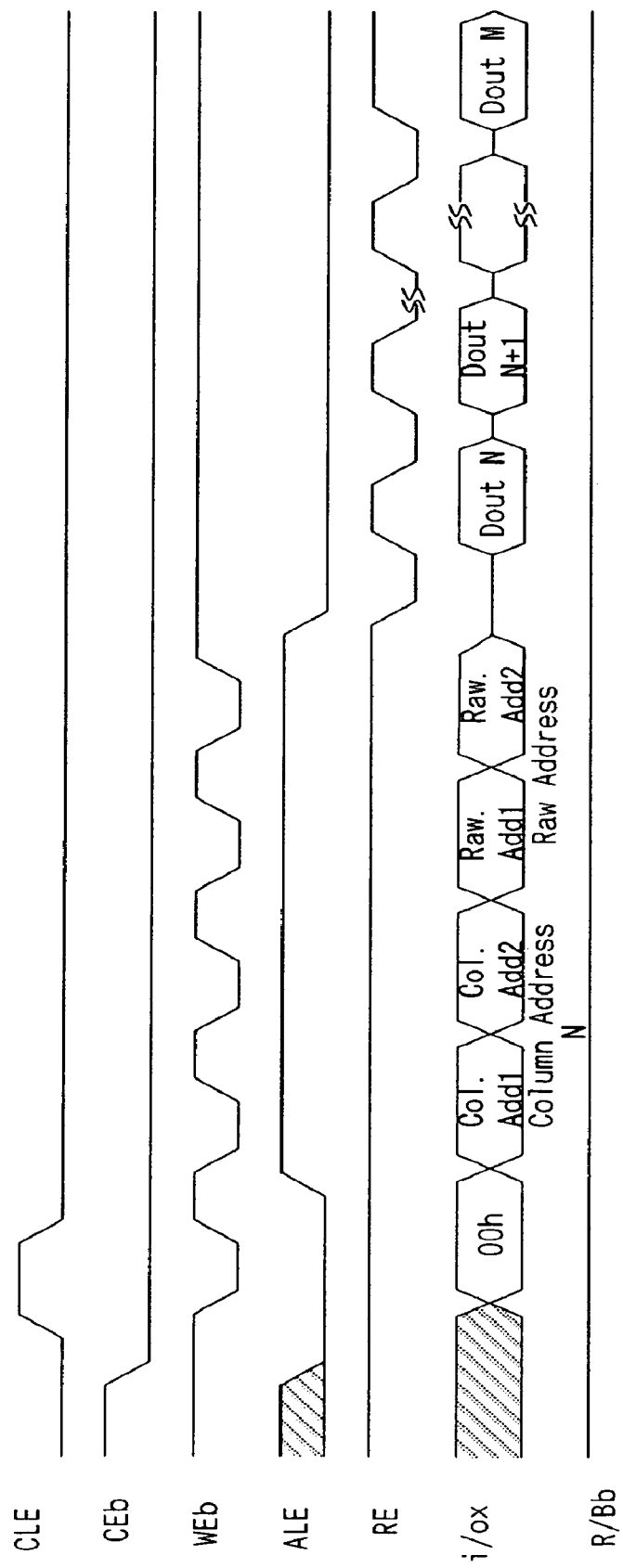
FIG. 23 is a timing chart showing a cache read operation.

FIG. 23 illustrates a cache read operation timing. This corresponds to the case of the command configuration in the column C of FIG. 6, and furthermore, corresponds to the read operation in the processing [3] of FIG. 19. After the address command is input, it is not necessary to wait for the operation of the flash memory array FARYi. Therefore, the R/Bb is not brought into the busy state but data can be immediately output to the outside.

Figure 24:
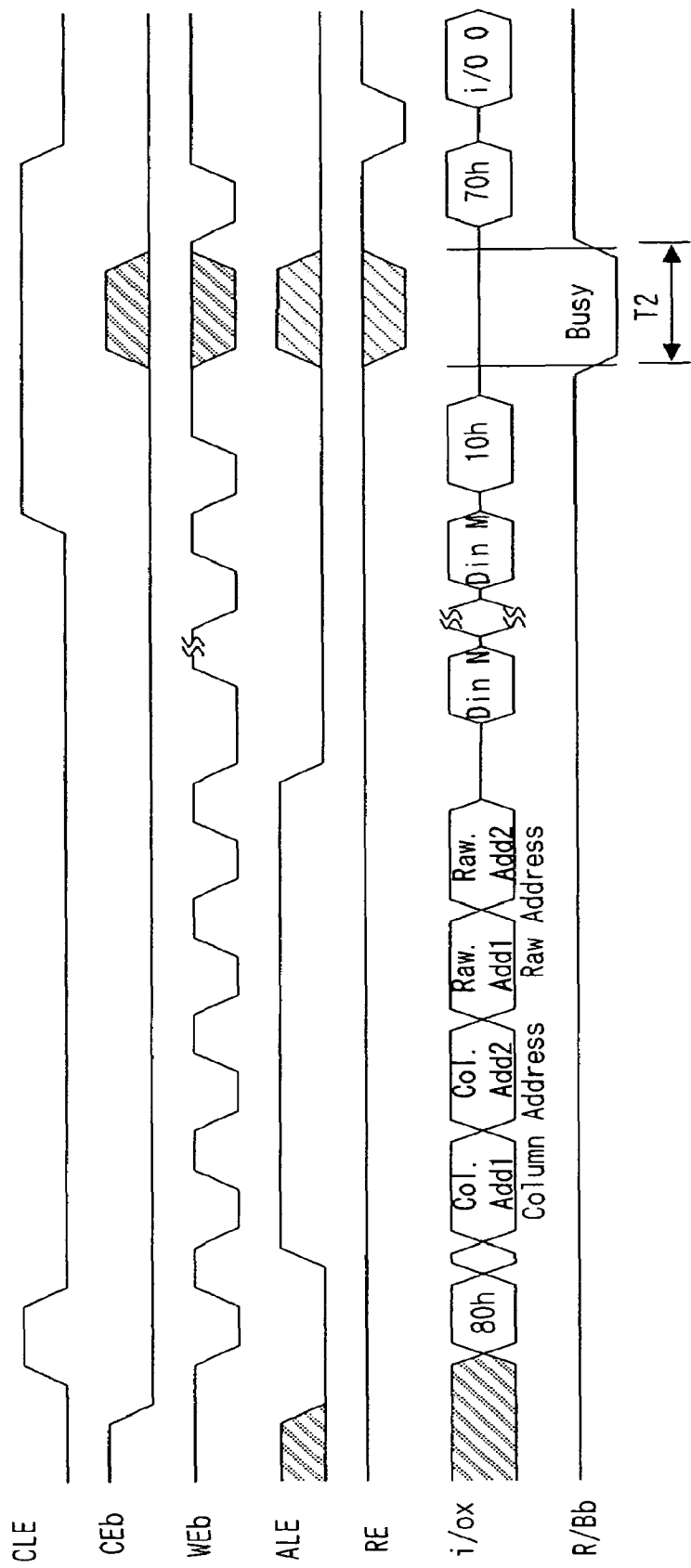
FIG. 24 is a timing chart showing a write operation.

FIG. 24 illustrates a write operation timing. This corresponds to the case of the command configuration in the column B of FIG. 6, and furthermore, corresponds to a write operation through the processings [1] and [2] of FIG. 21. In FIG. 24, Col.Add1 and Col.Add2 correspond to the CA and Raw.Add1 and Raw.Add2 correspond to the PA. A time T2 in FIG. 24 is equivalent to an operation time required for writing the data held in the buffer memory BMRYi to the flash memory array FARYi.

Figure 25:
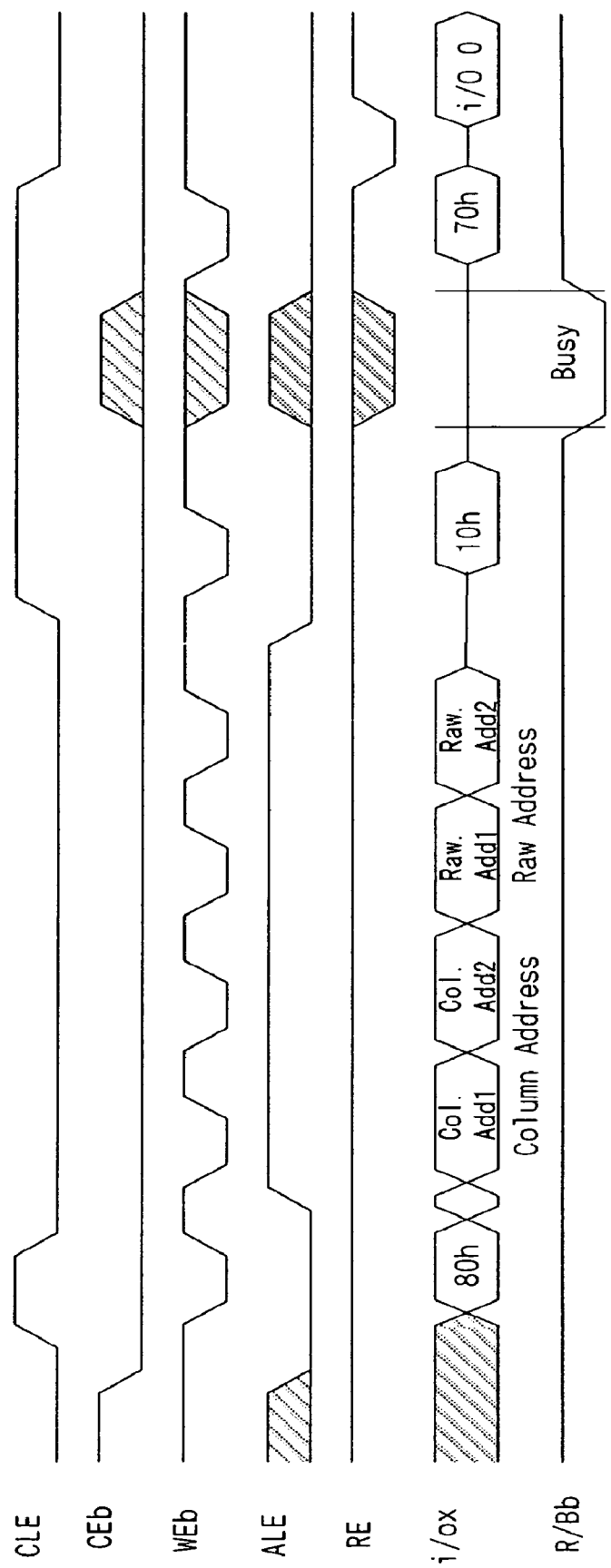
FIG. 25 is a timing chart showing a copy write operation.

FIG. 25 illustrates a copy write operation timing. This corresponds to the case of the command configuration in the column D of FIG. 6, and furthermore, corresponds to the write operation in the processing [3] of FIG. 21. After the address command is input, it is not necessary to wait for the write data to be transferred from the outside to the buffer memory BMRYi. Consequently, it is possible to shorten a time required for the whole write operation.

Figure 26:
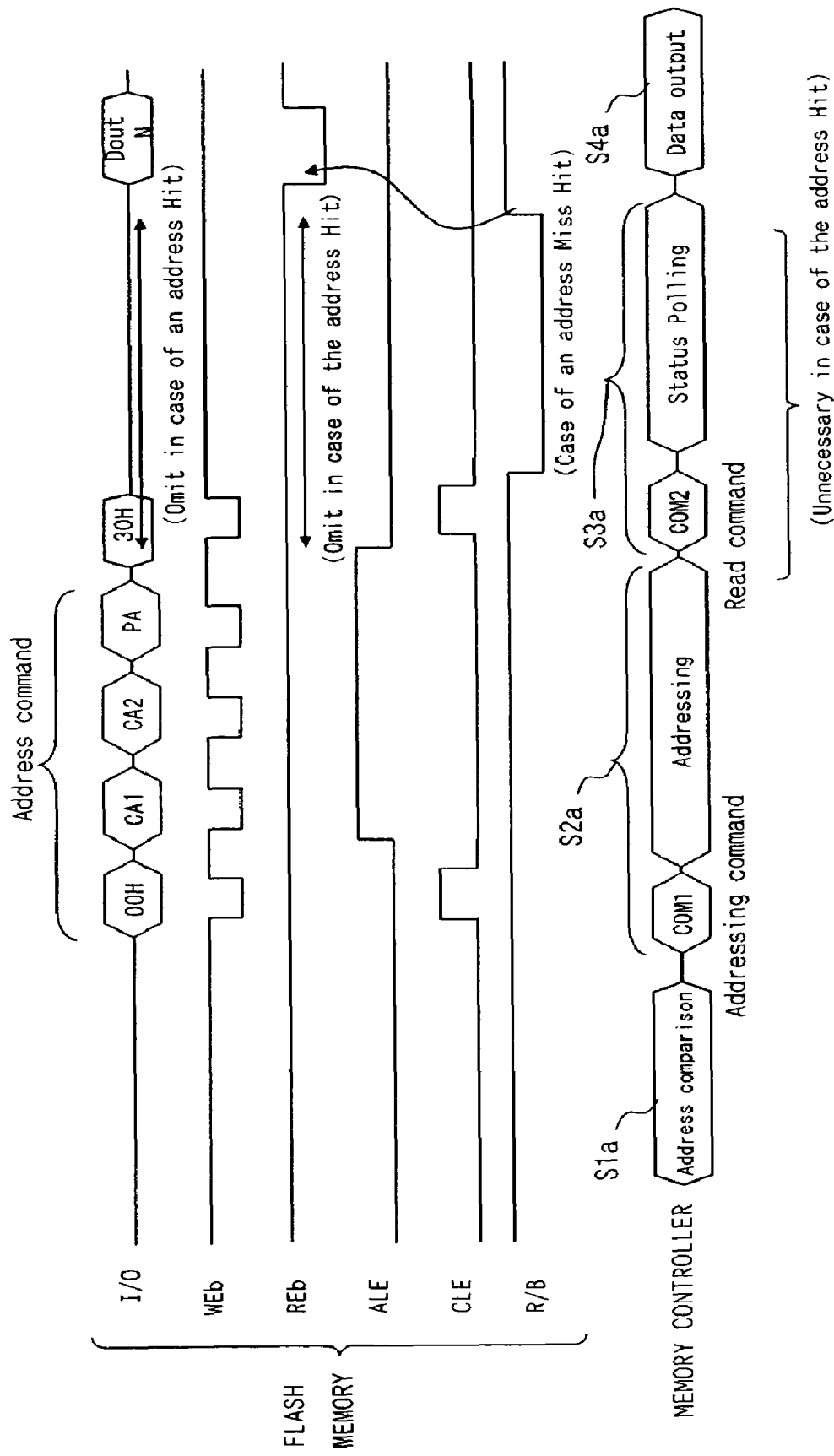
FIG. 26 is a timing chart showing an operation corresponding to the processing in FIG. 19 in which a memory controller carries out a page address comparison for the cache read operation.

FIG. 26 is a timing chart showing the case in which a page address comparison for the cache read operation is carried out by the flash memory controller MCNT, and this corresponds to the operation in the processing of FIG. 19. In FIG. 26, CA1 and CA2 correspond to the CA. When continuously carrying out a flash read access, the flash memory controller MCNT compares a page address to be read accessed with a page address which has been read accessed immediately before (S1a) and then outputs an address command (S2a). In the case in which the results of the S1 comparison are not coincident with each other, the flash memory controller MCNT then outputs an access command (for example, "30H") for the flash read access and waits for a change to the ready state through the status polling in response to the ready/busy signal R/Bb (S3a). During that time, the flash memory controller MCNT reads storage information from the specified page address and transfers the read data to the corresponding buffer memory BMRYi. When detecting the ready state, the flash memory controller MCNT outputs the read data from the buffer memory BMRYi to the outside synchronously with a change in the clock of the read enable signal REb (S4a). In the case in which the results of the S1a comparison are coincident with each other, the processing S3a is omitted and the flash memory controller MCNT immediately outputs the read data from the buffer memory BMRYi to the outside synchronously with the change in the clock of the read enable signal REb (S4a). The reason is that the storage information of a page address intended for an access has already been held in the corresponding buffer memory BMRYi in the flash read access processing immediately before. A command for carrying out the cache read processing may be the access commands of No. 2 and No. 3 in FIG. 7.

Figure 27:
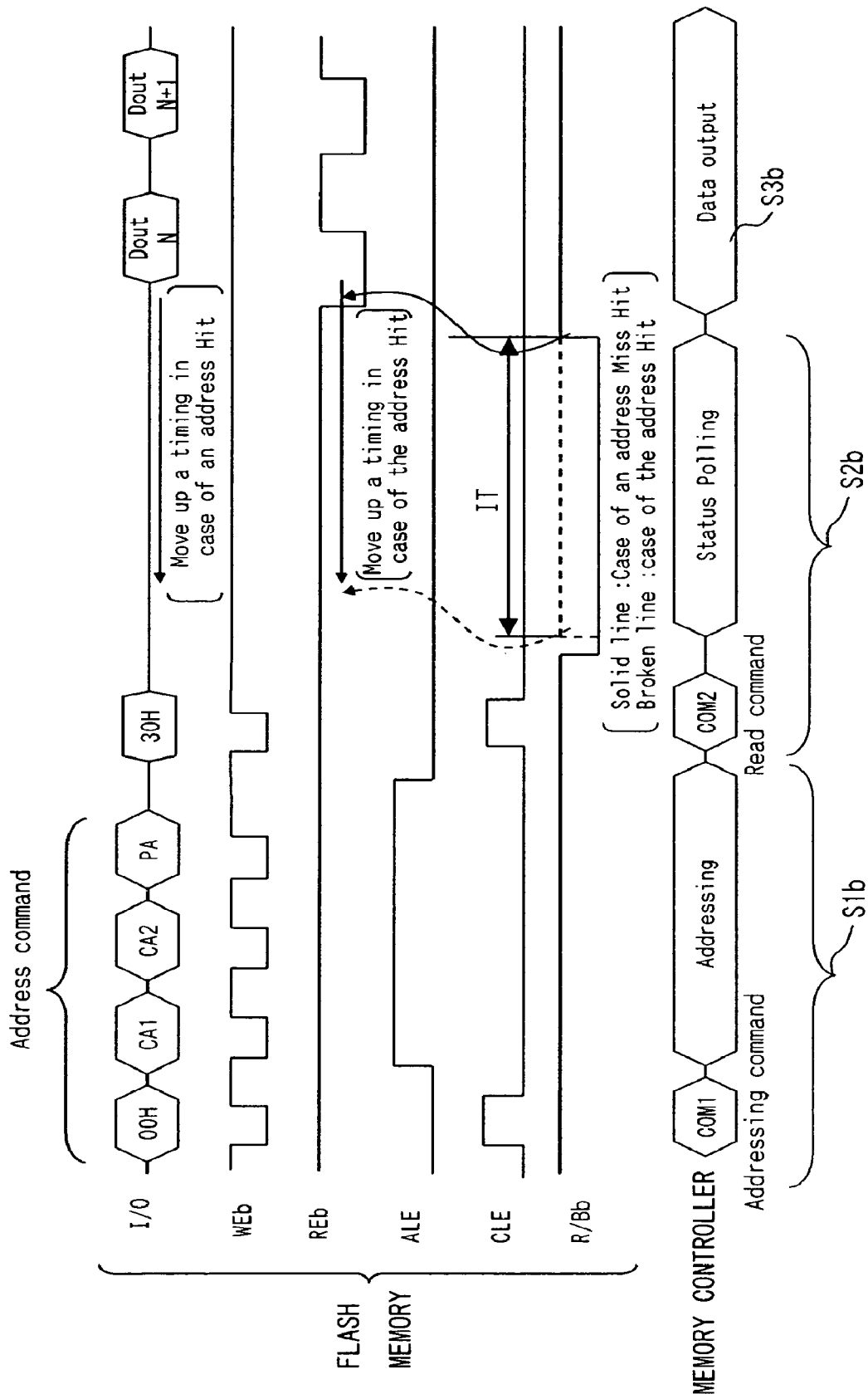
FIG. 27 is a timing chart showing an operation corresponding to the processing in FIG. 20 in which the flash memory carries out the page address comparison for the cache read operation.

FIG. 27 is a timing chart showing the case in which the page address comparison for the cache read operation is carried out by the flash memory, and this corresponds to the operation in the processing of FIG. 20. In FIG. 27, CA1 and CA2 correspond to the CA. When carrying out the flash read access, the flash memory controller MCNT immediately outputs an address command without performing the address comparison (S1b). Then, the flash memory controller MCNT outputs an access command (for example, "30H") for the flash read access and waits for a change to the ready state through the status polling in response to the ready/busy signal R/Bb (S2b). During that time, the flash memory compares a page address intended for the read access which is specified with a page address which has been subjected to the read access immediately before. In the case in which the results of the comparison are not coincident with each other, the flash memory reads storage information from the specified page address and transfers the read data to the corresponding buffer memory BMRYi, and then gives a notice of the ready state through the ready/busy signal R/Bb. In the case in which the results of the comparison are coincident with each other, the flash memory immediately gives the notice of the ready state through the ready/busy signal R/Bb. More specifically, a period for the status polling is shortened by a time IT through the coincidence of the results of the comparison. When detecting the ready state, the flash memory controller MCNT outputs, to the outside, data retained in the buffer memory BMRYi synchronously with a change in the clock of the read enable signal REb (S3b). A command for carrying out the cache read processing may be the access commands of No. 2 and No. 3 in FIG. 7.

Figure 28:
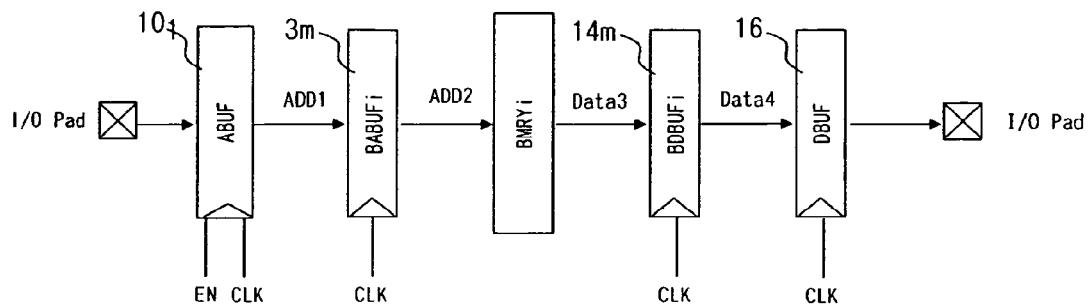
FIG. 28 is an explanatory diagram showing the pipeline of a data output system in the flash memory.

FIG. 28 shows the pipeline of a data output system in the flash memory 1. On a signal path to be used for the first access processing are provided an address buffer (ABUF) 10 for latching address information sent from the outside, a buffer unit address buffer (BABUF) 13m (m=a to d) for inputting the output of the address buffer 10 and supplying the same output to the buffer memory BMRYi, a buffer unit data buffer (BDBUF) 14m for latching data output from the buffer memory BMRYi, and a data buffer (DBUF) 16 for latching the output data of a buffer unit data buffer 14m and outputting the same output data to the outside. The number of pipeline stages from the address input to the data output is four. The address buffer 10 carries out a latch operation synchronously with a change in the clock of an enable signal EN, which is not particularly restricted. The buffer unit address buffer 13m, the buffer unit data buffer 14m and the data buffer 16 carry out the latch operation synchronously with a change in the clock of a clock signal CLK. The control unit CNT generates the enable signal EN and the clock signal CLK.

Figure 29:
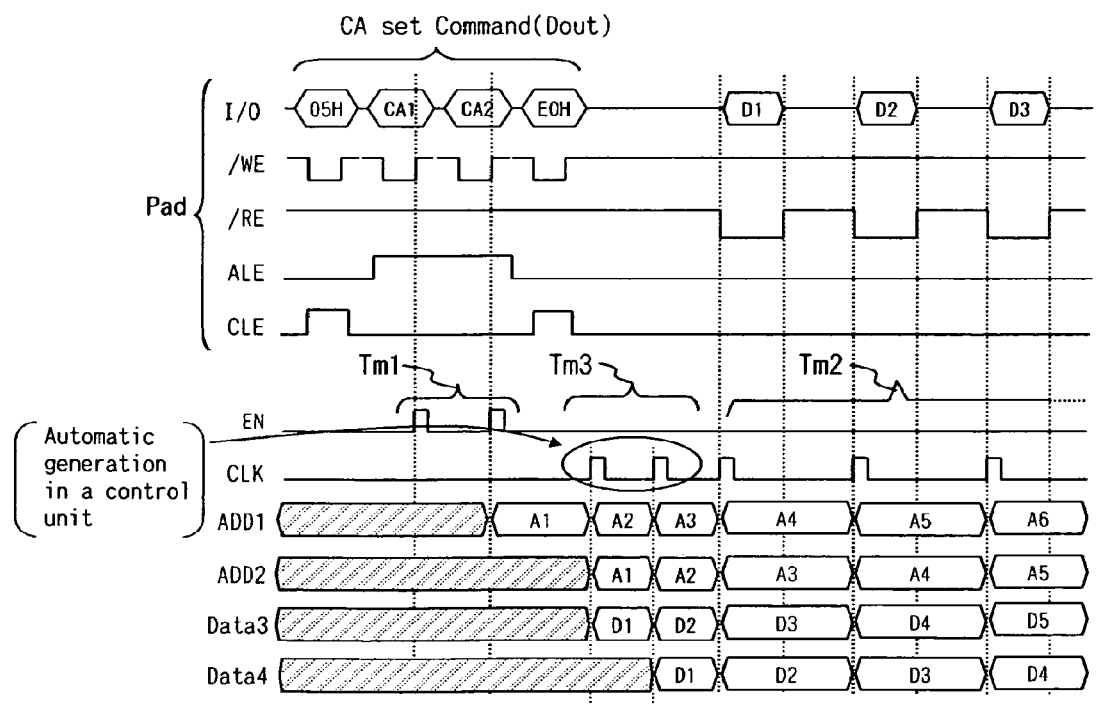
FIG. 29 is a timing chart illustrating each output signal waveform in the pipeline of FIG. 28.

FIG. 29 illustrates each output signal waveform in the pipeline of FIG. 28. When recognizing the address commands CA1 and CA2 synchronously with a change in the clock of a write enable signal (WEb) in an address latch enable state (ALE=H), the control unit CNT changes the clock of the enable signal EN synchronously with the change in the clock of the write enable signal (WEb) (Tm1). Moreover, the clock of the clock signal CLK is changed synchronously with a change in the clock of the read enable signal REb for giving the directive of a data read to the outside in a command latch disable state (CLE=L) and an address latch disable state (ALE=L) in the first access processing (Tm2).

The change in the clock of the Tm1 controls the initial latch operation of the address buffer 10, thereby deciding internal address information ADD1. The change in the clock of the Tm2 decides the initial data output of the data buffer 16. At this time, the control unit CNT independently changes the clock signal CLK in order to control the initial latch operations of the buffer unit address buffer 13m and the buffer unit data buffer 14m (Tm3). More specifically, the control unit CNT recognizes the address commands CA1 and CA2 synchronously with the change in the clock of the write enable signal (WEb) in the address latch enable state (ALE=H), and then generates, as dummy clocks, the latch timing of the buffer unit address buffer 13m and that of the buffer unit data buffer 14m before the read enable signal REb for giving the directive of the data read to the outside is changed in the first access processing.

In consideration of the case in which an accessing object address based on an address command is continuously provided in order of A1, A2, A3 . . . so that the read data are continuously present in order of D1, D2, D3 . . . , consequently, the output ADD1 of the address buffer 10 is decided to be A1 with the change in the clock of the Tm1 in an initial address input, an output ADD2 of the buffer unit address buffer 13m is decided to be A1 with the change in the clock at the beginning of next Tm3, and furthermore, data data1 read from the buffer memory BMRYi in a decided address a1 is decided to be D1. Output data data2 of the buffer unit data buffer 14m are decided to be D1 with a next change in the clock of the Tm3. Then, the initial data D1 are output from the data buffer 16 to the outside with the initial change in the clock of the Tm2. Succeeding data are sequentially output in a pipeline.

By independently generating the clock, it is possible to take a countermeasure against a pipeline operation in an initial portion even if the number of the pipeline stages from the address input to the data output is comparatively large.

Next, description will be given to a background data input operation.

Figure 30:
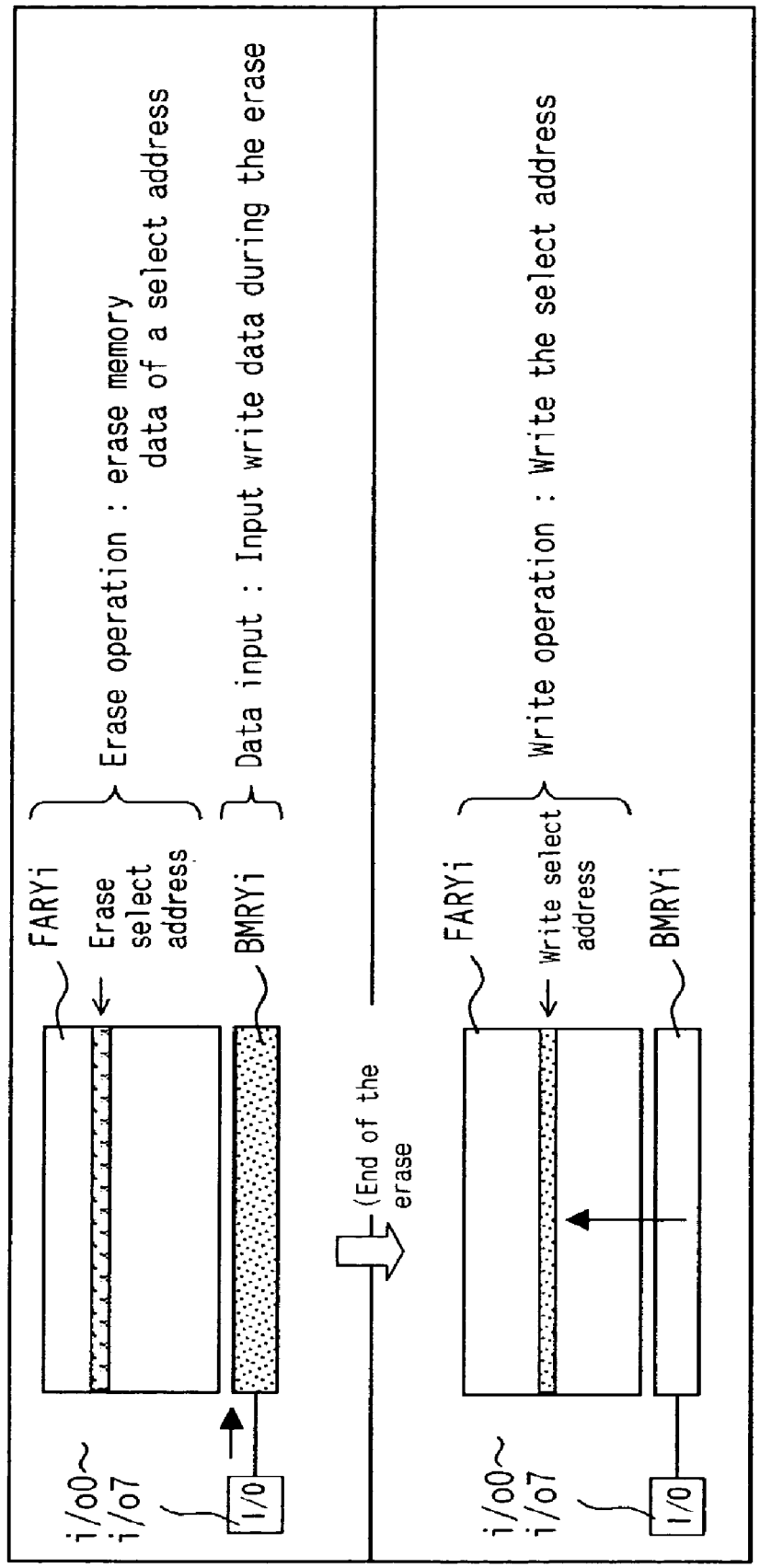
FIG. 30 is an explanatory diagram schematically illustrating a background data input operation.

FIG. 30 schematically illustrates the background data input operation. The background data input operation is set to be a data input operation for a high speed write to input data to be written next from the external input/output terminals i/o0 to i/o7 to the buffer memory BMRY1 and to shorten a write time after an erase while erasing the memory data of a select address in the flash memory array FARYi.

Figure 31:
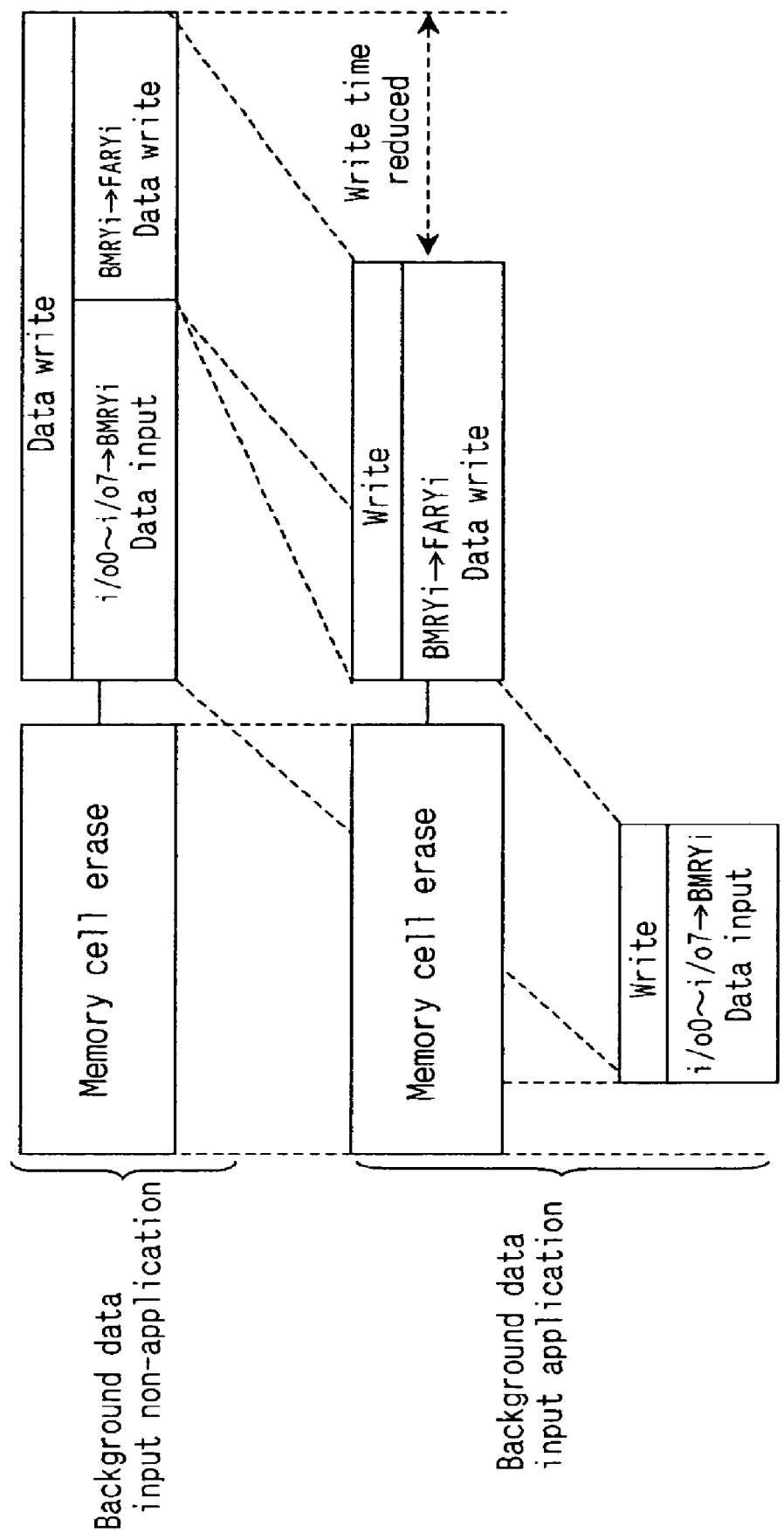
FIG. 31 is a timing chart illustrating a difference between a write operation utilizing the background data input and a write operation utilizing no background data input.

FIG. 31 is a timing chart illustrating a difference between a write operation utilizing the background data input and a write operation utilizing no background data input. The erase of the memory cell and the input of the write data from the external input/output terminals i/o0 to i/o7 to the buffer memory BMRYi are parallelized. Correspondingly, a write time to the flash memory array FARYi can be shortened.

Figure 32:
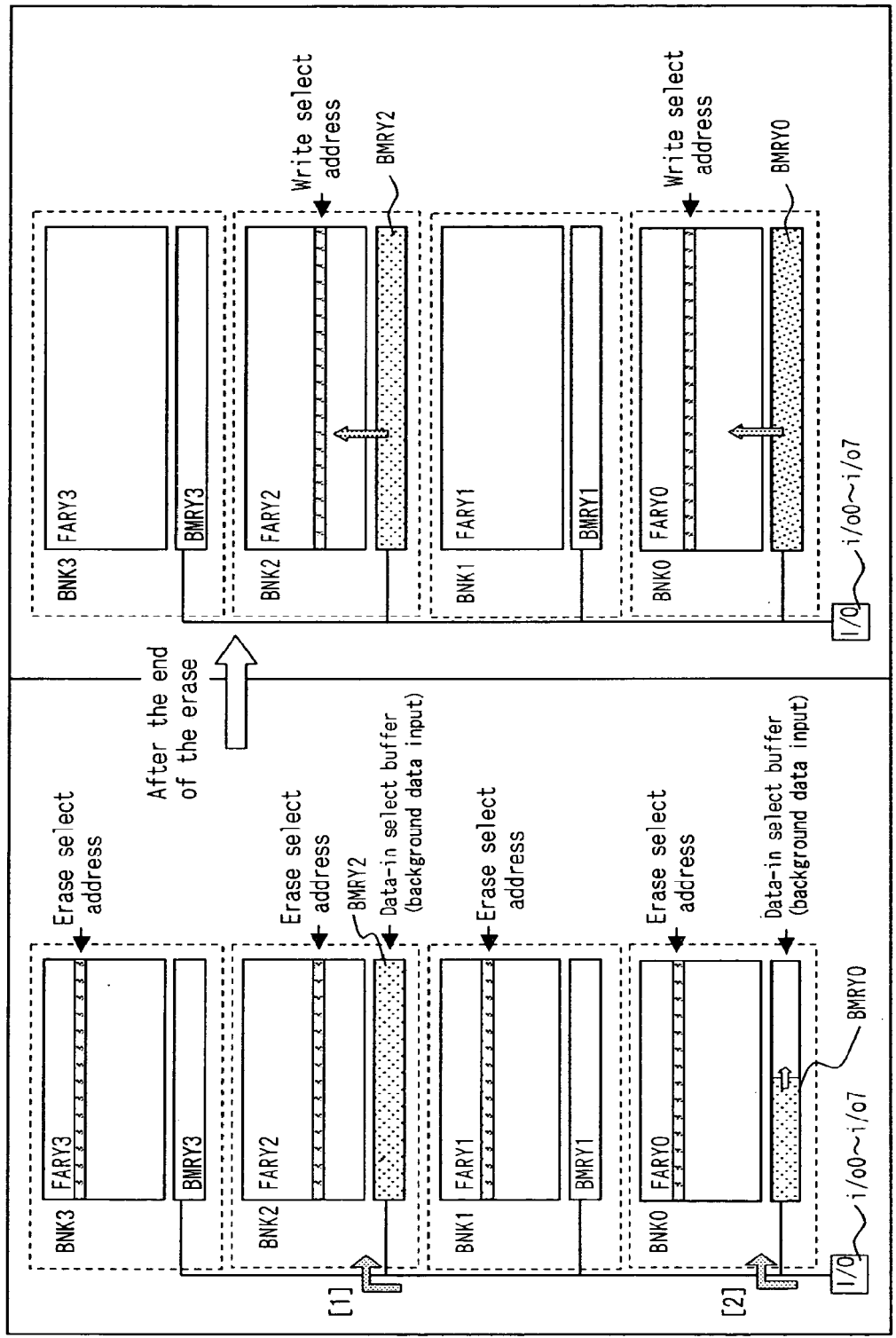
FIG. 32 is an explanatory diagram illustrating the more detailed concept of the background data input.

FIG. 32 illustrates the more detailed concept of the background data input. Herein, there is illustrated an operation for inputting write data to two buffer memories BMRY0 and BMRY2, for example, during a batch erase for the flash memory arrays FARY0 to FARY3 of four memory banks BNK0 to BNK3. First of all, when a multibank erase command is put in, an erase for the select block of each of the flash memory arrays FARY0 to FARY3 is carried out in a foreground. At the same time, in a background, write data are sequentially stored serially on an 8-bit unit in the buffer memories BMRY0 and BMRY2 specified in accordance with the address command. After the erase is ended, the write data of the buffer memories BMRY0 and BMRY2 are written to the select pages of the flash memory arrays FARY0 and FARY2 in the foreground.

Figure 33:
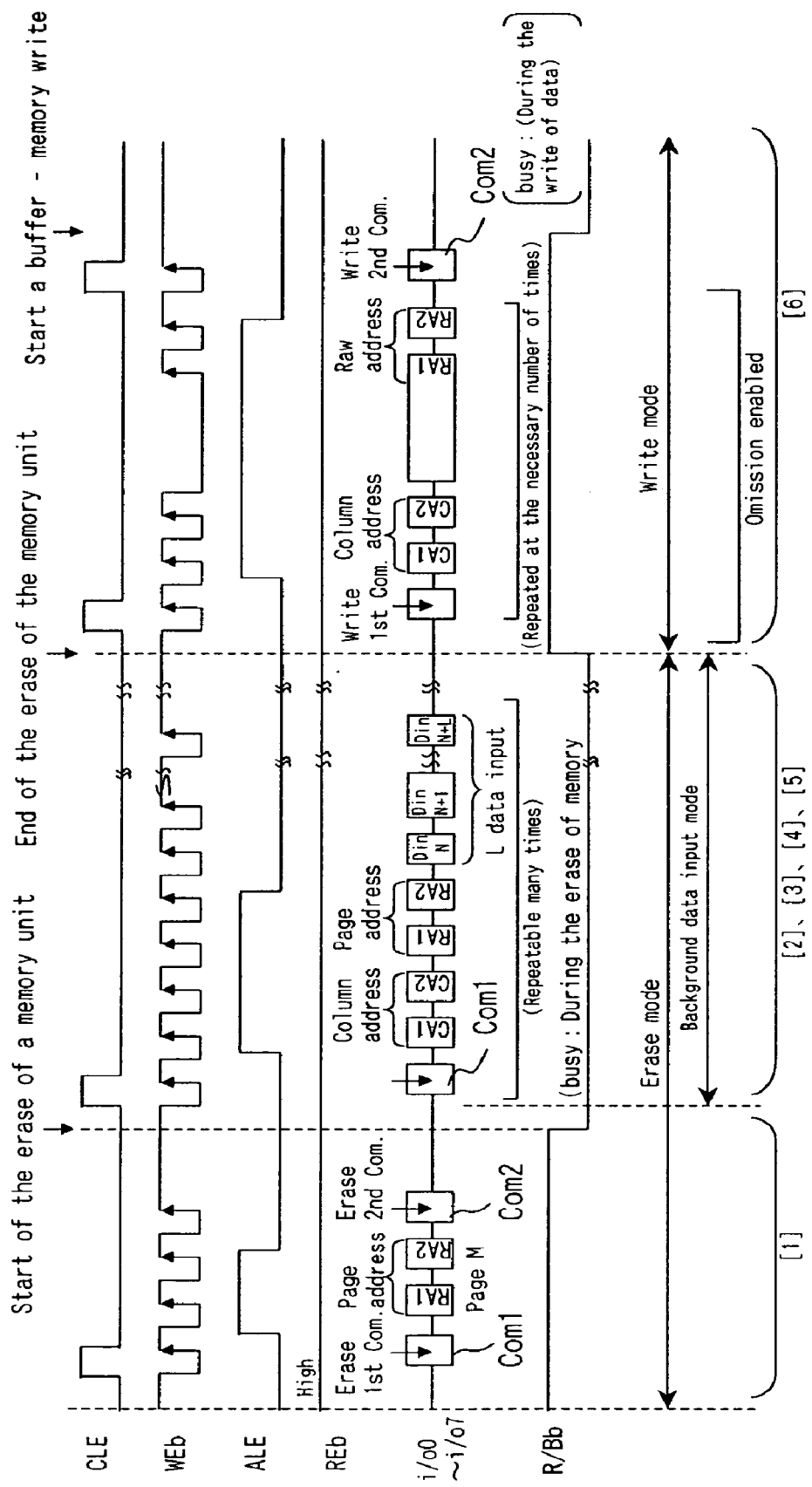
FIG. 33 is a timing chart showing erase and write operations which apply a background data input operation.

FIG. 33 is a timing chart illustrating erase and write operations to which the background data input operation is applied. Herein, there is illustrated the case in which data to be written next are subjected to the background data input while a 4-bank batch block erase is carried out for four continuous blocks over the memory banks BNK0 to BNK3.

First of all, when a first command code (Com1), for example, an erase command (erase 1st Com.) such as 60H, a page address (Page M), and a second command code (Com2), for example, a continuous 4-block erase start command (erase 2nd Com.) such as D1H are put in, the continuous 4-block erase including select pages over the memory banks BNK0 to BNK3 is started. After the erase is started, the read/busy signal R/Bb is changed into a Low level (L) so that a busy state is set.

During the busy state, a command input is carried out from the outside in order of a first command code (Com1), for example, an address command code such as 80H, a necessary column address (CA1, CA2), a page address (RA1, RA2) and write data (DinN . . . ) in order to give the directive of a data input to the buffer memory. Consequently, the write data are stored in the buffer memories corresponding to the column address (CA1, CA2) and the page address (RA1, RA2). By repeating the command input at the necessary number of times, it is possible to carry out the background data input operation over a plurality of buffer memories.

After a notice of the end of the erase is given to the outside through the ready/busy signal R/Bb, a second command (Com2), for example, a write command such as 13H (write 2nd Com.) is put in so that a write to a corresponding flash memory array is started from the buffer memory, for example. At this time, the write page is set to be a page specified in accordance with the page address (RA1 RA2) following the first command code (Com1), for example, an address command code such as 80H. In the case in which the write page to the flash memory array is to be changed, it is preferable that the address command code (write 1st Com.) such as 80H, the necessary column address (CA1, CA2) and the page address (RA1, RA2) should be inserted at the necessary number of times before the write command (write 2nd Com.) such as 13H as shown in FIG. 33.

Figure 34:
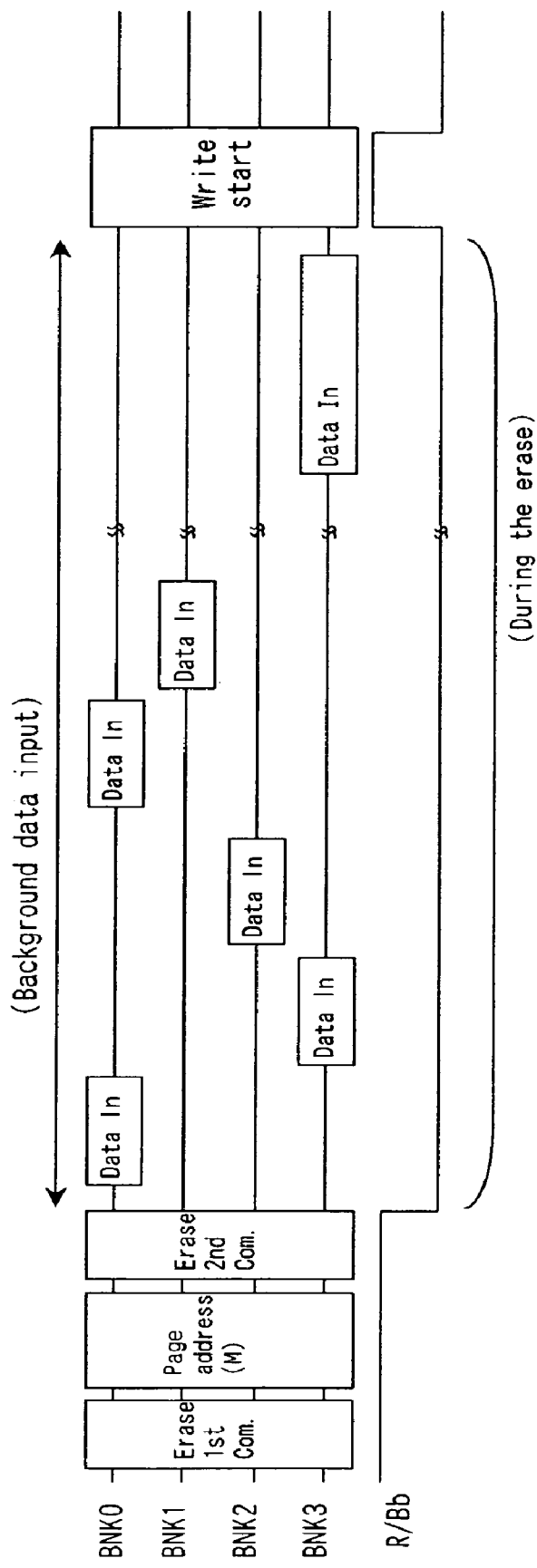
FIG. 34 is an explanatory diagram illustrating the data input operation of the buffer memory in the background data input operation in FIG. 33.

FIG. 34 illustrates the data input operation of the buffer memory in the background data input operation of FIG. 33. As is apparent from FIG. 34, write data (Data In) are input serially to the memory banks BNK0 to BNK3 simultaneously with an erase operation to be carried out after the continuous 4-block erase start command (erase 2nd Com.) is put in.

Figure 35:
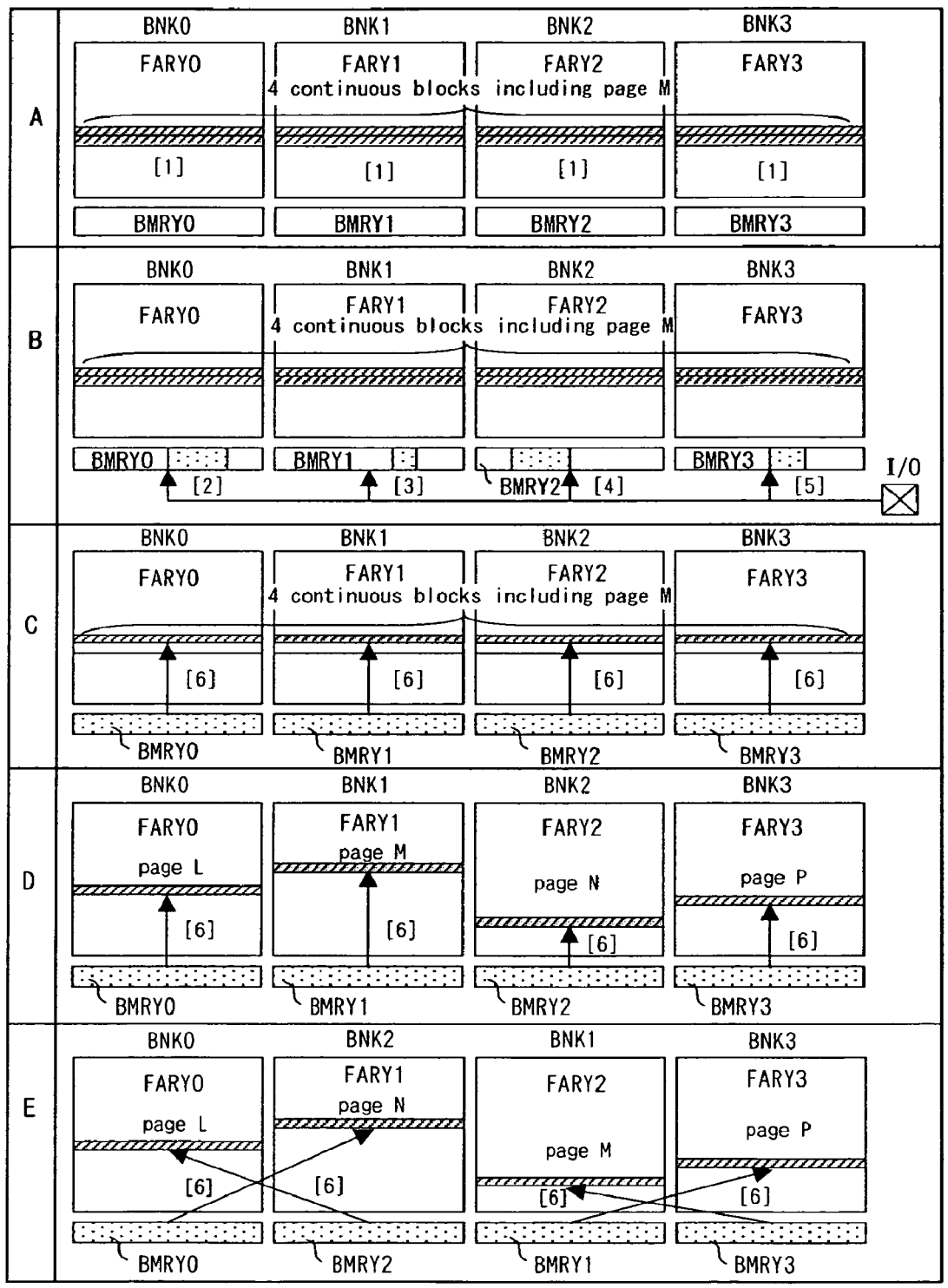
FIG. 35 is an explanatory diagram illustrating the operation state of the buffer memory and the flash memory array in the background data input operation in FIG. 33.

FIG. 35 illustrates the operation states of the buffer memory and the flash memory array in the background data input operation of FIG. 33. A column A in FIG. 35 shows a state in which the continuous 4-block erase is started for a block including a select page in each memory bank. A column B in FIG. 35 shows a state in which write data to the flash memory array are subjected to the background data input to the buffer memory during an erase. The order of the operations [2] to [5] may be optional. A column C in FIG. 35 illustrates a state in which a write is started by putting in a write operation start command after the end of the erase operation. This example indicates the case in which the write is carried out at the same page address as an erase select page. A write page address for the flash memory array can also be optional as shown in a column D of FIG. 35. It is preferable to put in the address command code again to carry out addressing before putting in the write operation start command. As illustrated in a column E of FIG. 35, moreover, it is also possible to carry out a write operation using a buffer memory having a non-preferential relationship with the flash memory array. It is preferable that a write start command such as 12H or 17H should be utilized.

Figure 36:
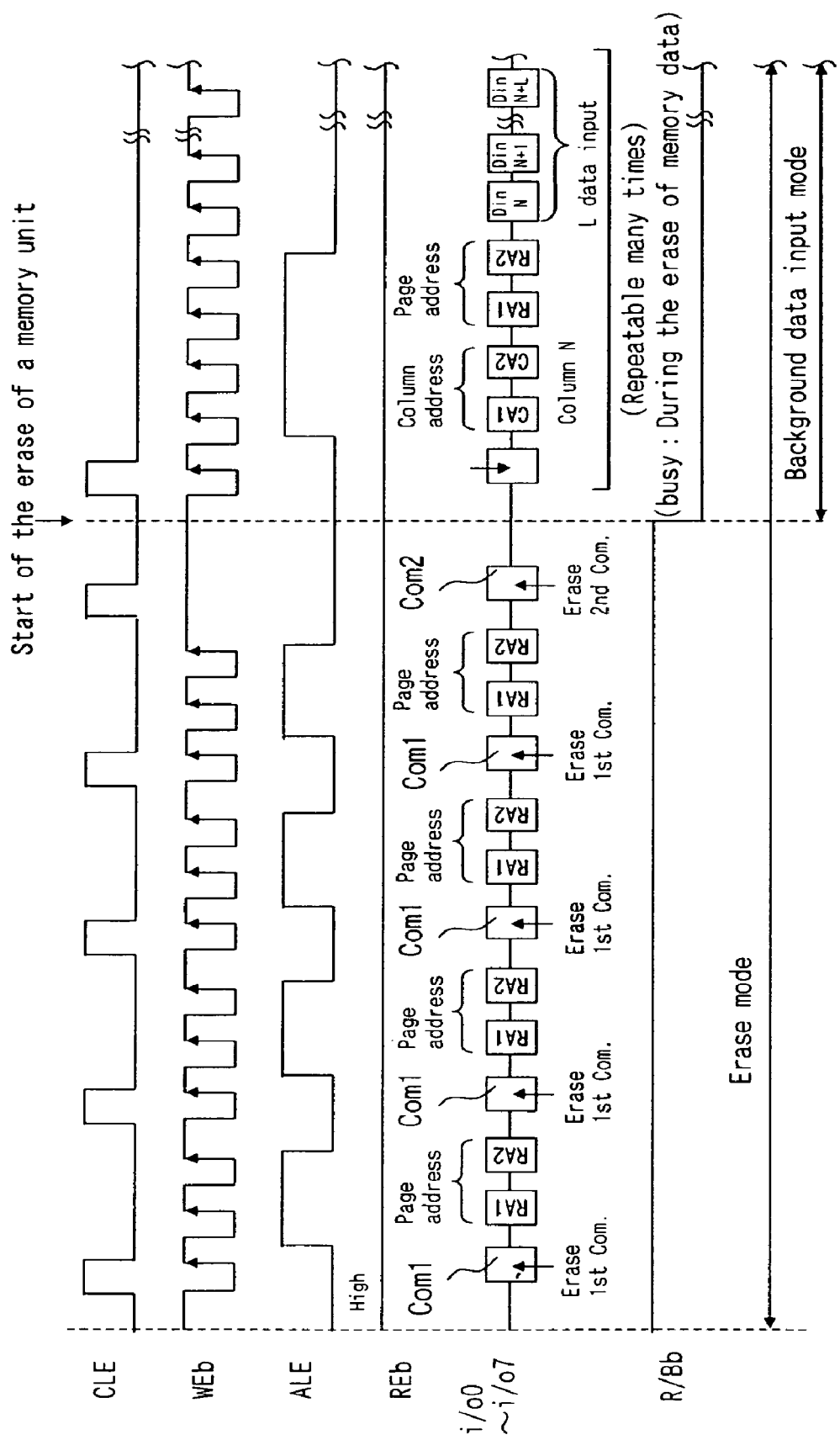
FIG. 36 is a timing chart showing the background data input operation to be carried out in parallel with a multibank erase.

FIG. 36 illustrates the background data input operation to be carried out simultaneously with a multibank erase. The multibank erase implies an operation for selecting and erasing different pages in each of the banks. When the specification of the first command code (Com1), for example, an erase command (erase 1st Com.) such as 60H and a page address is repeated four times and the second command code (Com2), for example, an erase start command such as D0H is then put in, a batch erase for the page address specified by each of the memory banks BNK0 to BNK3 is started. Simultaneously with the erase operation, the same background data input operation as that described in FIG. 33 can be carried out.

Figure 37:
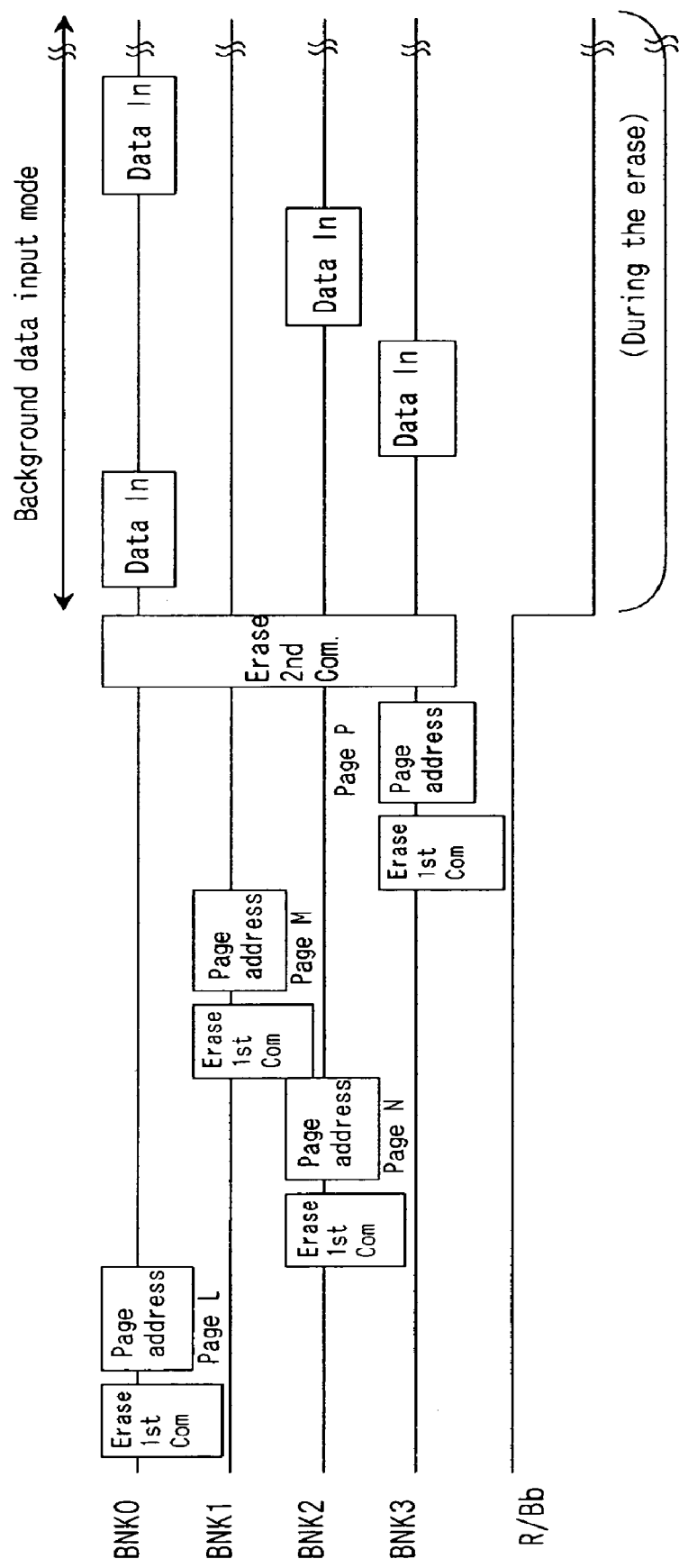
FIG. 37 is an explanatory diagram illustrating the multibank erase in FIG. 36 and the data input operation of the buffer memory in the background data input operation to be carried out thereafter.

FIG. 37 illustrates the multibank erase in FIG. 36 and the data input operation of the buffer memory in a subsequent background data input operation. In the multibank erase, the erase page address of the memory bank BNK0 is represented as pageL, the erase page address of the memory bank BNK1 is represented as pageM, the erase page address of the memory bank BNK2 is represented as pageN, and the erase page address of the memory bank BNK3 is represented as pageP. As is apparent from FIG. 37, the write data (Data In) are input serially to the memory banks BNK0 to BNK3 simultaneously with the erase operation to be carried out after the 4-bank batch block erase start command (erase 2nd Com.) is put in.

Figure 38:
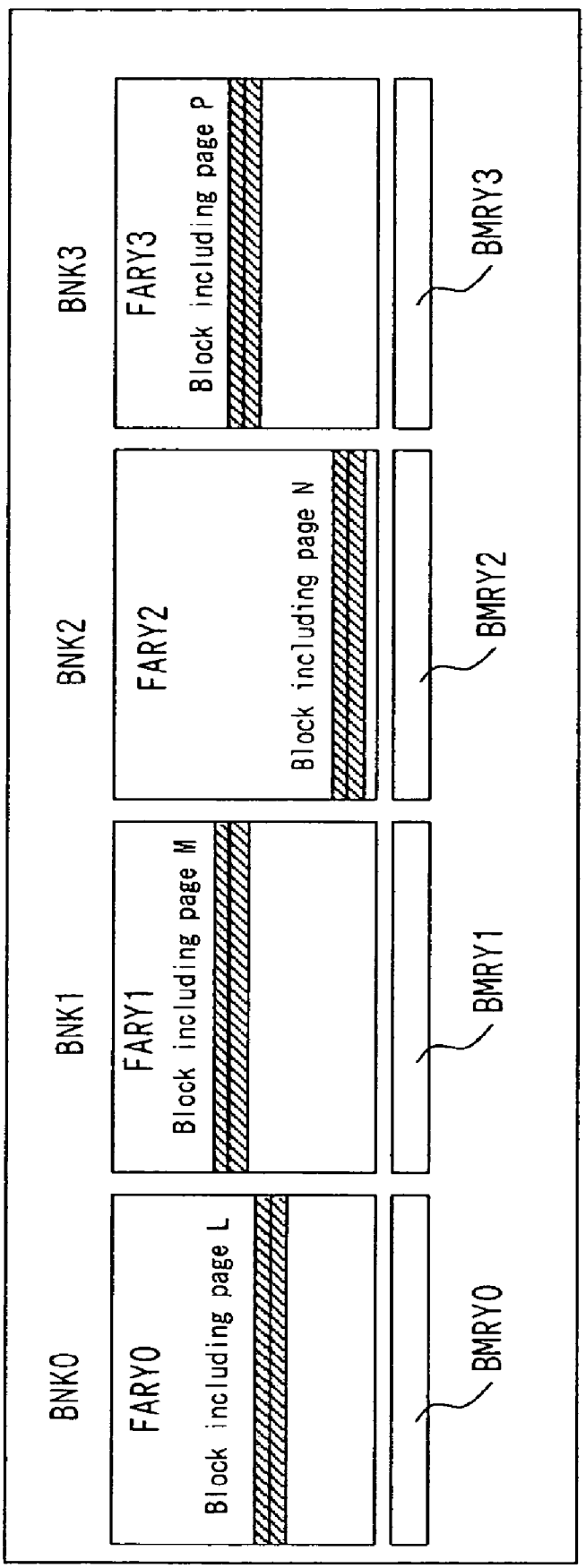
FIG. 38 is an explanatory diagram showing the state of an erase block in each of memory banks BNK0 to BNK3 by the multibank erase in FIG. 37.

FIG. 38 shows an erase block in each of the memory banks BNK0 to BNK3 based on the multibank erase in FIG. 37.

Figure 39:
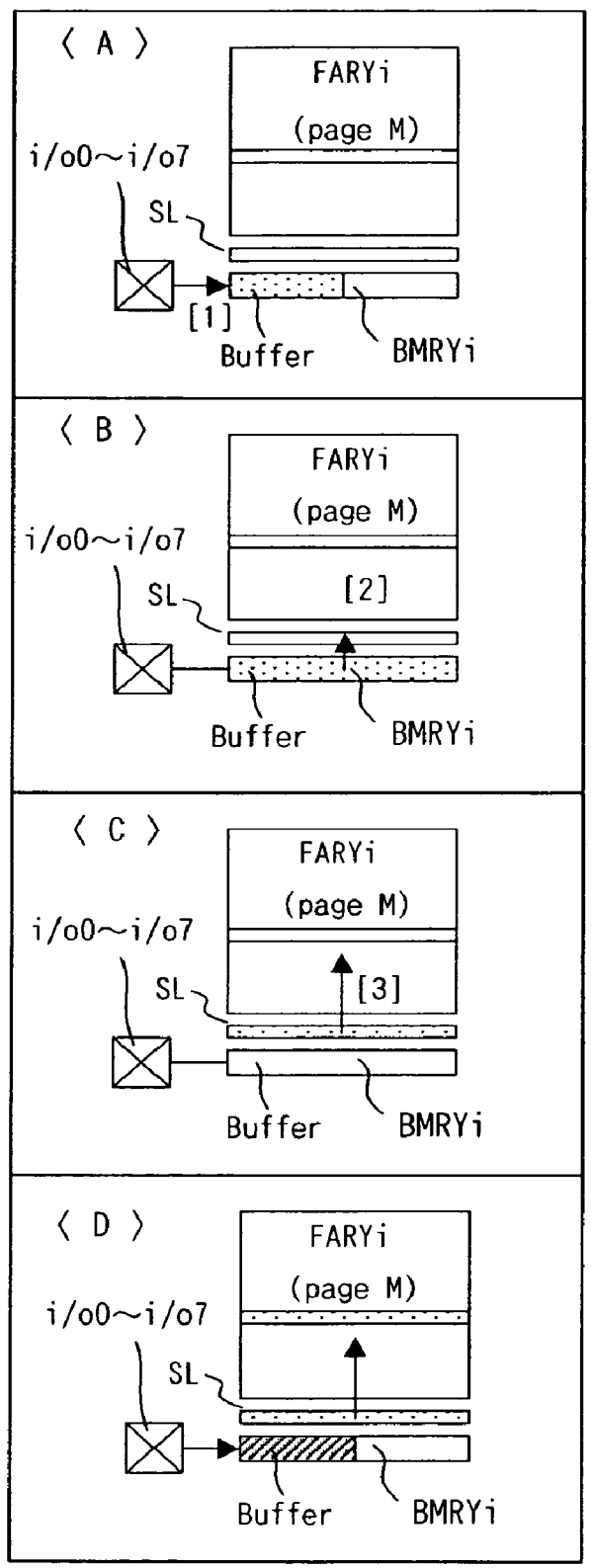
FIG. 39 is an explanatory diagram illustrating the summary of the background data input operation in the write operation.

FIG. 39 illustrates the summary of the background data input operation for inputting next write data into the buffer of a write bank while transferring the write data in the buffer memory and then writing the data into the memory array of a select page during the write operation. First of all, the write data are stored from the external data input/output terminals i/o0 to i/o7 into the buffer memory BMRYi as shown in <A> of FIG. 39. As shown in <B>, next, the write data of the buffer memory BMRYi are latched into the sense latch SL of the corresponding flash memory array FARYi. The data latched into the sense latch SL are started to be written to the memory cell as shown in <C>. During the write, next write data are input from the outside to the buffer memory BMRYi as shown in <D>.

Figure 40:
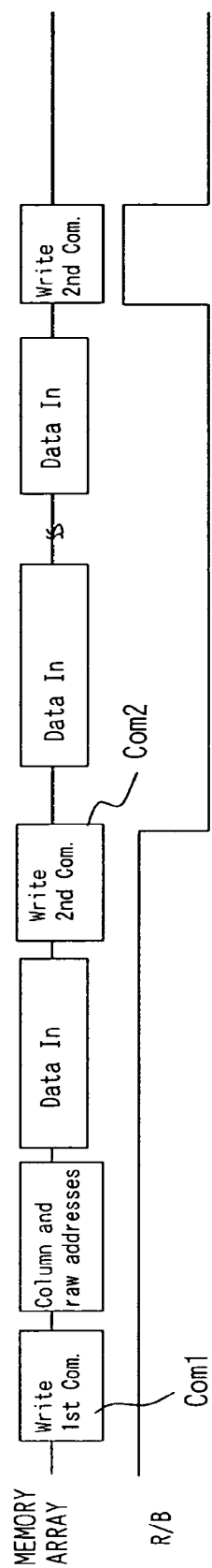
FIG. 40 is a timing chart showing the write operation in FIG. 39 and the background data input operation.
Figure 41:
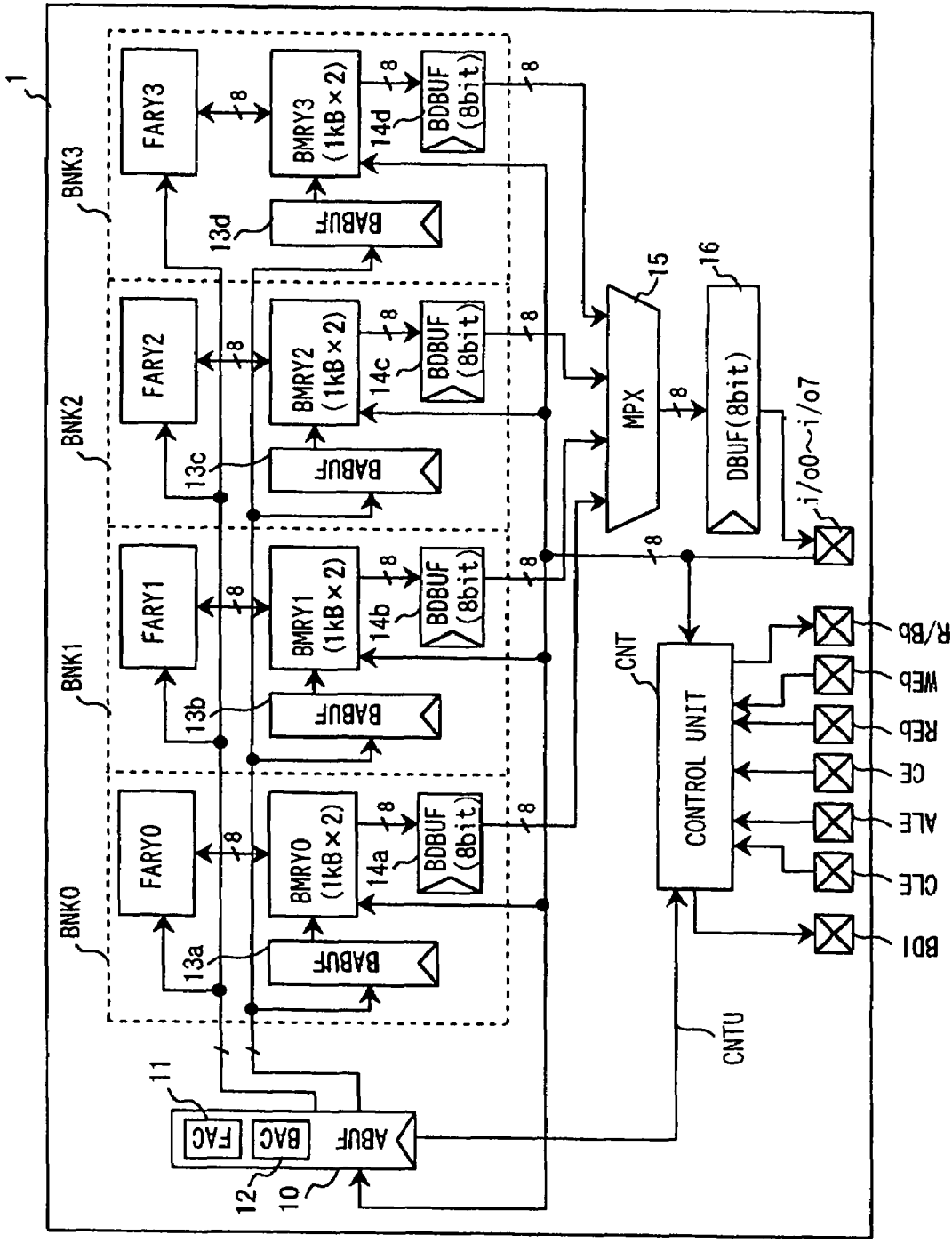
FIG. 41 is a block diagram showing an example in which a state of write data transferred from the buffer memory to a sense latch can be detected on an outside.

FIG. 40 is a timing chart showing the write operation in FIG. 39 and the background data input operation. A command is input from the outside in order of the first command code (Com1), for example, an address command code such as 80H, a necessary column address and page address and write data (Data In). Consequently, the write data are stored in the buffer memory corresponding to the column address and the page address. Then, the second command (Com2), for example, the write command (write 2nd Com.) such as 10H is put in so that the write from the buffer memory to the corresponding flash memory array is started, for example. At this time, the write page is set to be a page specified by a page address following the first command code (Com1), for example, the address command code such as 80H. In this case, the ready/ busy signal R/Bb is first set to have a Low level and a notice of a busy state is given to the outside. First of all, the write data are fetched from the memory buffer into the sense latch in the flash memory array and a write operation to the memory cell is started in accordance with the write data fetched into the sense latch. When the write data are input from the outside in accordance with the flow of the data input shown in the column B of FIG. 6 during the write operation to the memory array (Data In), next write data are stored in the buffer memory. Thereafter, the second command (Com2), for example, the write command (write 2nd Com.) such as 10H is put in as described above so that the write from the buffer memory to the corresponding flash memory array is started, for example. In the operations of FIGS. 39 and 40, the write data are transferred from the buffer memory to the sense latch and the next write data are then started to be stored in the buffer memory. The timing can be implemented by waiting for the passage of a predetermined time after detecting the change of the ready/busy signal R/Bb into the busy state by an external memory controller. As illustrated in FIG. 41, alternatively, the control unit CNT asserts a signal BDI upon receipt of a count-up signal CNTU of the FAC 11 in the ABUF 10. The assert timing of the signal BDI is brought into the busy state and is set to be a timing in which the write data are completely transferred from the buffer memory to the sense latch. It is preferable that the external memory controller should supply the next write data (Data In) to the flash memory in accordance with a data input command after the signal BDI is asserted.

According to the flash memory described above, the following functions and advantages can be obtained.

[1] The directive or command of the access processing for the flash memory 1 is divided into two systems having a flash system (a transfer between a flash memory array and an on-chip buffer memory) and a buffer system (a transfer between the on-chip buffer memory and i/o). By using them in combination or singly, it is possible to give an access to the flash memory 1. By thus dividing the command into the two systems, it is possible to give an access to the on-chip buffer memory from the outside in parallel in such an operation mode as not to utilize the on-chip buffer memory BMRYi as in the erase operation. By positively utilizing the transfer between the high-speed on-chip buffer memory and the i/o, moreover, it is possible to carry out a cache read. By providing writing serial clock (WEb signal) and reading serial clock (REb signal) terminals and preparing an addressing command (for example, the commands of No. 2 and No. 3 in FIG. 7) which can specify the value of the address buffer from the outside, furthermore, it is possible to input/output data between the on-chip buffer memory designated by the address buffer and the i/o synchronously with an external clock even if the command input is not present during a standby.

[2] The data on the on-chip buffer memory BMRYi are held until a buffer clear command is input. Therefore, a user can manage the data on the on-chip buffer memory BMRYi.

[3] In the operation mode of the flash system, it is possible to accept the command of the buffer system for the on-chip buffer memory BMRYi which is not used.

[4] The operation unit of the buffer system command is set to be a page unit. By using a command specifying the address (=CA) in a page together, however, it is also possible to selectively transfer an optional region in the page.

[5] The operation unit of the flash system command is also the page unit. In such an operation, however, the selective transfer of the optional region in the page between the buffer memories BMRY0 and BMRY3 is not implemented. The reason is that a control can be prevented from being extremely complicated. In addition, it is supposed to be substantially sufficient that an optional selection in the page is implemented in accordance with the buffer system command.

[6] By writing sector management information or ECC data such as storage information as binary data to the flash memory array FARYi, it is possible to directly transfer the storage information from the flash memory array FARYi to the i/o without carrying out the binary ⇔4-value conversion over the data (a direct flash access mode). Consequently, it is possible to carry out an immediate transition to a control processing using the sector management information or the ECC data by the memory controller MCNT. Thus, it is possible to contribute to a whole reduction in an access processing time for a file or data.

[7] There is prepared the addressing command (the commands of No. 2, No. 3 and No. 4 in FIG. 7) capable of directly specifying the buffer memory BMRYi mounted on the flash memory chip 1 from the outside. Therefore, the data of the buffer memory BMRYi can be transferred between the i/o and the buffer memory synchronously with the signals REb and WEb.

[8] The page address of a select page (=a page to be operated) is input to the address buffer in accordance with an addressing command in write and read modes so that the access address of the flash memory array is determined, and furthermore, the address of the on-chip buffer memory is also decided uniquely. Therefore, an operation for specially carrying out the addressing of the buffer memory is not required.

[9] By preparing the two address latch circuits 30 and 31 and the address comparing circuit 32, it is possible to control the cache read operation by the flash memory itself.

[10] By the background data input represented by such an operation as to input the next write data to the buffer memory unit during the erase operation of the flash memory array FARYi, it is possible to further increase the speed of the rewrite operation of data to the flash memory array FARYi.

[11] As described above, it is possible to implement a high-speed rewrite, a cache read and a high-speed copy write and to enhance the convenience of a flash memory chip. It is possible to improve the performance of a flash memory card using such a flash memory chip.

While the invention made by the inventor has specifically been described based on the examples, the invention is not restricted thereto but various changes can be made without departing from the scope of the invention.

For example, while there has been employed the serial transfer method for transferring data on a page unit in series by using the SRAM for carrying out a byte unit access for the buffer memory, it is also possible to use a data latch circuit using a parallel transfer method capable of internally transferring the data on the page unit together with the flash memory array.

While the serial clock for writing and reading to and from the buffer memory is prepared for writing (WEb) and reading (REb) separately, it is also possible to separately prepare a buffer system control command. In that case, the serial clock can be shared into one.

The size of the buffer memory may be n pages (n: a natural number which is greater than 1) or more for each bank.

The invention can also be applied to a binary flash memory in addition to a multivalued, for example, four-valued flash memory. Moreover, the storage format of the multivalued flash memory is not restricted to the case in which a threshold voltage is sequentially varied according to the value of the storage information but there may be employed a memory cell structure utilizing a charge trap film (a silicon nitride film) for locally changing a place in a memory cell where an electric charge is to be held and storing information in a multivalue. Furthermore, it is also possible to employ another storage format such as a high dielectric memory cell as a non-volatile memory cell.

Moreover, the invention can also be applied to a non-volatile storage device having a singular memory bank. The specification of a buffer unit is not restricted to a tacit specification but a positive specification may be carried out in accordance with an address command. However, the information content of the address command is increased.

In addition, the invention may employ a structure in which an address terminal for inputting an address is provided in addition to a structure in which both an address and data are multiplexed and are input to an I/O terminal. It is also possible to have a command for specifying either an access to a buffer memory or an access to a flash memory array in accordance with the address input from the address terminal. In this case, it is also possible to determine an access destination in response to a control signal for specifying an access to either the buffer memory or the flash memory. Also in this case, furthermore, it is possible to give an access from the flash memory to the buffer memory on a page unit and to give an access to the buffer memory on a byte unit.

INDUSTRIAL APPLICABILITY

The invention comprises, as an on-chip non-volatile memory, a flash memory chip having an on-chip buffer memory, a flash memory card capable of mounting the flash memory chip and a flash memory having a buffer memory, and can be widely applied to a semiconductor integrated circuit such as a microcomputer or a system LSI.

What is claimed is:

1. A nonvolatile memory structured on one semiconductor substrate, comprising:
   a plurality of memory banks, each comprising a nonvolatile memory unit and a buffer unit;
   a control circuit; and
   an interface,
   wherein the control circuit controls access to one or more of the plurality of memory banks in accordance with an arbitrary one of a plurality of instructions received from outside via the interface,
   wherein when receiving a first erase instruction, the control circuit performs one of a one block erase operation or a plural block erase operation in response to whether one block is selected or plural blocks are selected before receiving the first erase instruction, and
   wherein when receiving a second erase instruction, the control circuit erases data stored in all of the buffer units of the plurality of memory banks.

2. A nonvolatile memory according to claim 1,
   wherein in response to receiving the first erase information the control circuit selects one or more blocks for erasing based on address information received from outside before receiving the first erase instruction, and
   wherein in response to receiving the second erase instruction the control circuit erases data stored in all of the buffer units of the plurality of memory banks without receiving address information from outside.

3. A nonvolatile memory according to claim 2,
   wherein the control circuit receives an address specifying instruction with each received address information, and selects the one or more blocks in accordance with the address specifying instruction.

* * * * *